US012597944B2

(12) United States Patent　　　　　(10) Patent No.:　US 12,597,944 B2
Cochet et al.　　　　　　　　　　　(45) Date of Patent:　　　Apr. 7, 2026

(54) TOP-DOWN RELATIVE DAC CALIBRATION

(71) Applicant: International Business Machines Corporation, Armonk, NY (US)

(72) Inventors: Martin Cochet, South Salem, NY (US); John Francis Bulzacchelli, Somers, NY (US); Timothy O. Dickson, Ridgefield, CT (US)

(73) Assignee: International Business Machines Corporation, Armonk, NY (US)

( * ) Notice: Subject to any disclaimer, the term of this patent is extended or adjusted under 35 U.S.C. 154(b) by 585 days.

(21) Appl. No.: 18/091,513

(22) Filed: Dec. 30, 2022

(65) Prior Publication Data

US 2024/0223208 A1　　　Jul. 4, 2024

(51) Int. Cl.
　　　*H03M 1/82*　　　　(2006.01)
　　　*H03M 1/10*　　　　(2006.01)
(52) U.S. Cl.
　　　CPC ......... *H03M 1/825* (2013.01); *H03M 1/1009* (2013.01)
(58) Field of Classification Search
　　　CPC .......... H03M 1/10; H03M 1/82; H03M 1/466; H03M 1/0845; H03M 1/1009; H03M 1/1245
　　　See application file for complete search history.

(56) References Cited

U.S. PATENT DOCUMENTS 6,556,154 B1　　4/2003　Gorecki et al.
7,466,252 B1　　12/2008　Radulov et al.

7,719,452 B2　　5/2010　Bardsley et al.
8,102,007 B1　　1/2012　Hyde et al.
8,416,107 B1　　4/2013　Wan et al.
9,154,152 B1　　10/2015　Chiu et al.
9,276,598 B1　　3/2016　Li et al.
9,432,044 B1 *　8/2016　Lee ..................... H03M 1/1061
9,484,947 B1　　11/2016　Nguyen
10,020,817 B1 *　7/2018　Zhang ................... H03M 3/502
10,511,316 B2　　12/2019　Bodnar et al.
10,523,228 B1 *　12/2019　Chao ................... H03M 1/1033

(Continued)

OTHER PUBLICATIONS

Kim, J., et al., "Flexible-Assignment Calibration Technique for Mismatch-Constrained Digital-to-Analog Converters", IEEE Transactions on Very Large Scale Integration (VLSI) Systems, Sep. 2014, pp. 1934-1944, vol. 22, No. 9.

(Continued)

*Primary Examiner* — Lam T Mai
(74) *Attorney, Agent, or Firm* — Kimberly Zillig

(57)　　　　　　ABSTRACT

A system and method for calibrating a digital-to-analog converter (DAC) device. The method includes tuning a second subset of one or more DAC segments to match a strength of a first subset of DAC segments wherein the first subset of DAC segments is of a strength nominally equal to that of the second subset of DAC segments. The process is iterative, and the second subset of DAC segments is associated with lesser significant bits than the bits associated with the first subset of DAC segments. The process is repeated to tune each of successive second subsets of DAC segments to corresponding successive first subsets of DAC segments in top-down order from a segment associated with a MSB input to a segment associated with a LSB input. In each case the first subset of DAC segments is of a strength nominally equal to that of the second subset of DAC segments.

20 Claims, 16 Drawing Sheets

(56)     References Cited

U.S. PATENT DOCUMENTS

| | | | | | |
|---|---|---|---|---|---|
| 10,581,442 | B2 | | 3/2020 | Kauffman et al. | |
| 10,855,300 | B2 | | 12/2020 | Gruber et al. | |
| 12,381,572 | B2 | * | 8/2025 | Fei ........................ | H03M 1/742 |
| 2005/0001747 | A1 | * | 1/2005 | Kuyel ................. | H03M 1/1038 |
| | | | | | 341/118 |
| 2008/0159374 | A1 | | 7/2008 | Lin et al. | |
| 2012/0098687 | A1 | * | 4/2012 | Wilhite ................. | H03M 1/109 |
| | | | | | 341/120 |
| 2015/0311910 | A1 | * | 10/2015 | Song ................... | H03M 1/1023 |
| | | | | | 341/120 |
| 2019/0181879 | A1 | * | 6/2019 | Zhang ................... | H03M 1/661 |
| 2022/0006465 | A1 | | 1/2022 | Yu et al. | |
| 2022/0085823 | A1 | | 3/2022 | Yu et al. | |
| 2023/0238973 | A1 | * | 7/2023 | Neema ................. | H03M 1/785 |
| | | | | | 341/118 |
| 2024/0063809 | A1 | * | 2/2024 | Mulder ............... | H03M 1/1057 |
| 2024/0223199 | A1 | * | 7/2024 | Cochet ................ | H03M 1/1014 |

OTHER PUBLICATIONS

Qiu, D., et al., "A 14-bit 100 MS/s Self-Calibrated DAC With a Randomized Calibration-Period", 10th IEEE International Conference on Solid-State and Integrated Circuit Technology, 2010, 3 pages.
Shen, D-L., et al., "A 10-Bit Binary-Weighted DAC with Digital Background LMS Calibration", IEEE Asian Solid-State Circuits Conference, Nov. 12-14, 2007, pp. 352-355.
Toprack-Deniz, Z., et al., "A 128-GB/s 1.3-pJ/b PAM-4 Transmitter With Reconfigurable 3-Tap FFE in 14-nm CMOS", IEEE Journal of Solid-State Circuits, Jan. 2020, pp. 19-26, vol. 55, No. 1.

* cited by examiner

TOP-DOWN RELATIVE DAC CALIBRATION

BACKGROUND

The present disclosure is related to digital-to-analog converter (DAC) devices and particularly, a circuit and method for calibrating a DAC device.

There has been a dramatic rise of data transport, e.g., over the Internet, and wireline systems carrying such data are pressed for increasingly higher speeds. Integral nonlinearity (INL) reduction is important to improve high-speed wireline performance. Integral nonlinearity (INL) is a measure of performance in digital-to-analog converter (DAC) devices. In DACs, INL is a measure of the deviation between the ideal output value (which is linearly proportional to the input code) and the actual measured output value for a certain input code. Differential non-linearity (DNL) is usually measured in least significant bits (LSB) and is a measure characterizing the difference between two successive voltage levels that a DAC produces. DNL can further be characterized as the error difference between actual step width and ideal value (1 LSB). DNL can further be measured as an absolute value (either volts or amperes) or as a fraction of a least significant bit (LSB).

While DAC-based transmitters (TXs) operating at tens or hundreds of gigabits per second are becoming the norm for high-speed wireline links, it is the case that differential drivers naturally introduce $3^{rd}$ order non-linearity (a form of INL), and random mismatch in the DAC can also degrade linearity, including DNL. This DAC non-linearity, especially DNL, can impact performance of wireline transmission.

One solution is for the DAC-based transmitter to include some partial thermometer encoding in the DAC to reduce the impacts of mismatch. In the literature, a DAC architecture in which some of the bits (typically the more significant bits) are encoded as thermometer bits, and the rest of the bits (typically the less significant bits) are encoded as binary bits, is commonly referred to as a "segmented" DAC architecture.

SUMMARY

There is provided a system and method that calibrates DAC-based transmitters to compensate for random mismatch of its segments.

In an aspect, the method relies on a relative calibration of DAC segments only, not using any absolute references.

According to this aspect, the relative calibration method employed only relies upon 1:1 segment comparisons. Further, the calibration method uses a top down-approach to reduce any error build-up.

The system and method that calibrates DAC-based transmitters compensates the mismatch between DAC segments to reduce DAC DNL.

In one aspect, there is provided a system for calibrating a digital-to-analog converter device (DAC). The system comprises: a comparator device having a first input receiving, in an iterative fashion, a first output voltage from a DAC under calibration in a first iteration and a second output voltage from the DAC under calibration in a second subsequent iteration, the first output voltage corresponding to a summation of outputs provided by a first subset of one or more DAC segments of the DAC being calibrated, and the second output voltage corresponding to a summation of outputs provided by a second subset of one or more DAC segments of the DAC being calibrated, the first subset of DAC segments being of a strength nominally equal to that of the second subset of DAC segments; a voltage DAC (VDAC) circuit receiving, at the first iteration, an input digital word that is tuned to generate a reference output voltage substantially equal to the first output voltage, wherein at the first iteration, the comparator device receives at a second input, the generated reference output voltage and compares the first output voltage with the reference output voltage, and the input digital word is tuned until an output signal of the comparator device indicates that the reference output voltage generated by the VDAC is substantially equal to the first output voltage; the comparator device, at the second iteration, receiving at the second input, the reference output voltage generated at the first iteration and comparing, at the second iteration, the received second output voltage with the reference output voltage, the comparator device providing an output signal based on a difference between the second output voltage and the reference output voltage; and a control logic circuit receiving the comparator device output signal, and in response to the comparator device output signal, generating one or more calibration signals for input to the DAC under calibration to tune the second subset of one or more DAC segments of the DAC being calibrated such that a strength of a summation of outputs provided by the second subset of one or more DAC segments substantially equals the reference output voltage, the control logic circuit iteratively tuning, using the one or more calibration signals, each of the relative strengths of DAC segment outputs of successive second subsets of DAC segments to match each of corresponding successive first subsets of DAC segments, the subsequent first subsets of DAC segments being of strengths nominally equal to those of the subsequent second subsets of DAC segments.

In a further aspect, there is provided a method for calibrating a digital-to-analog converter device (DAC), the DAC having plural DAC segments generating an output voltage signal responsive to activated input bits. The method comprises: receiving, at a first input of a comparator device, in an iterative fashion, a first output voltage from a DAC under calibration in a first iteration and a second output voltage from the DAC under calibration in a second subsequent iteration, the first output voltage corresponding to a summation of outputs provided by a first subset of one or more DAC segments of the DAC being calibrated, and the second output voltage corresponding to a summation of outputs provided by a second subset of one or more DAC segments of the DAC being calibrated, the first subset of DAC segments being of a strength nominally equal to that of the second subset of DAC segments; receiving at a voltage DAC (VDAC) circuit, at the first iteration, an input digital word that is tuned to generate a reference output voltage substantially equal to the first output voltage, wherein at the first iteration, the comparator device receives at a second input, the generated reference output voltage and compares the first output voltage with the reference output voltage, and tuning the digital word until an output signal of the comparator device indicates that the reference output voltage generated by the VDAC is substantially equal to the first output voltage; receiving at a second input of the comparator device, at the second iteration, the reference output voltage generated at the first iteration and comparing, by the comparator device at the second iteration, the received second output voltage with the reference output voltage, the comparator device providing an output signal based on a difference between the second output voltage and the reference output voltage; and receiving, at a control logic circuit, the comparator device output signal, and generating, at the control logic circuit, in response to the receiving the comparator device output signal, one or more calibration signals for input to the DAC under calibration to tune the second subset of one or more DAC segments of the DAC being calibrated such that a strength of a summation of outputs provided by the second subset of one or more DAC segments substantially equals the reference output voltage, and iteratively tuning, by the control logic circuit, using the one or more calibration signals, each of the relative strengths of DAC segment outputs of successive second subsets of DAC segments to match each of corresponding successive first subsets of DAC segments, the subsequent first subsets of DAC segments being of strengths nominally equal to those of the subsequent second subsets of DAC segments.

Embodiments of the invention will be described in more detail below, by way of illustrative and non-limiting examples, with reference to the accompanying drawings.

DETAILED DESCRIPTION

In reference to FIGS. 1-8, some general aspects and terms of embodiments of the invention are described.

Figure 1:
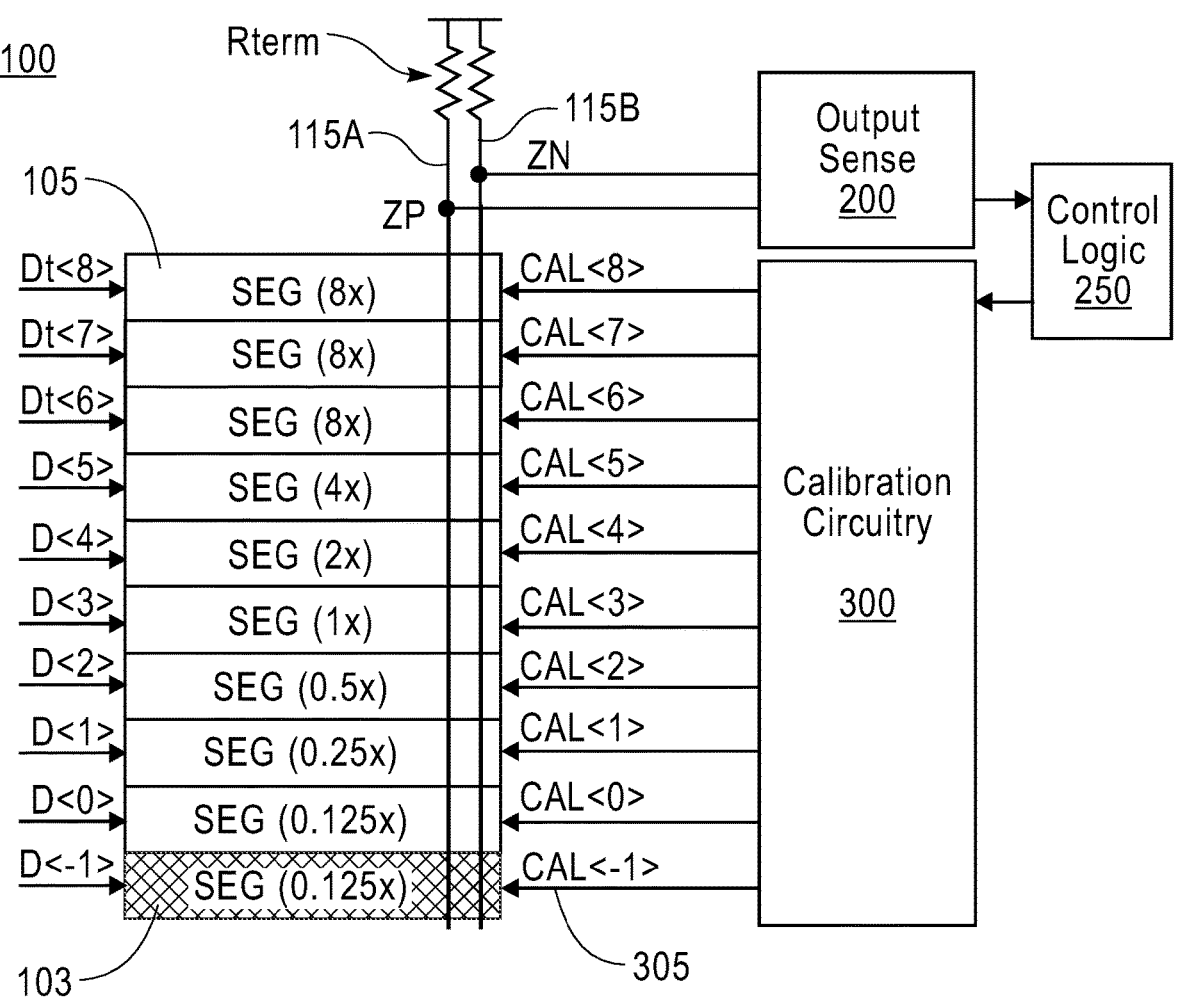
FIG. 1 depicts a representation of a system for calibrating a DAC device including an output sense circuit for measuring the strength of a DAC output signal and a calibration circuit that can operate responsive to sensed DAC output values to calibrate the DAC to remove mismatch-induced non-linearities according to an embodiment.

FIG. 1 depicts a representation of a system for calibrating a DAC device 100 that is configured to output, responsive to an input code, a corresponding DAC output signal. The system includes an output sense circuit 200 for measuring the strength of a DAC output signal and a calibration circuit 300 that can operate responsive to sensed DAC output values to calibrate the DAC to remove any non-linearities (e.g., INL or DNL).

In an illustrative, non-limiting embodiment, the DAC 100 of FIG. 1 is an 8-bit TX DAC based on current-mode logic (CML) segments, which can convert a digital input code comprising a plurality of binary-scaled bits and/or equal sized thermometer bits corresponding to input code values ranging from 0 to 255 into a corresponding output signal. As shown in FIG. 1, the example 8-bit DAC 100 employs a segmented architecture and receives digital input data, e.g., binary bits D<0>, . . . , D<5> as well as thermometer bits labeled Dt<6>, Dt<7> and Dt<8>. A further LSB "spare" bit D<−1> is shown as an input to the DAC 100. In the 8-bit DAC 100, for an input digital code word, bit D<0> is referred to as a Least Significant Bit (LSB) and Dt<8> is a most significant bit (MSB). Thus, for the example 8-bit DAC 100, an input bit code (Dt<8> to D<−1>) 0000000000 corresponds to (→) input code value 0, input code 0000000010→1, input code 0000000110→3, input code 0000001000→4, . . . , input code 0001111110→$2^5$+$2^4$+$2^3$+$2^2$+$2^1$+$2^0$=63, input code 0010000000→$2^6$=64, input code 0110000000→$2^6$+$2^6$=128, input code 1110000000→$2^6$+$2^6$+$2^6$=192, and input code 1111111110→192+63=255.

Figures 2, 3:
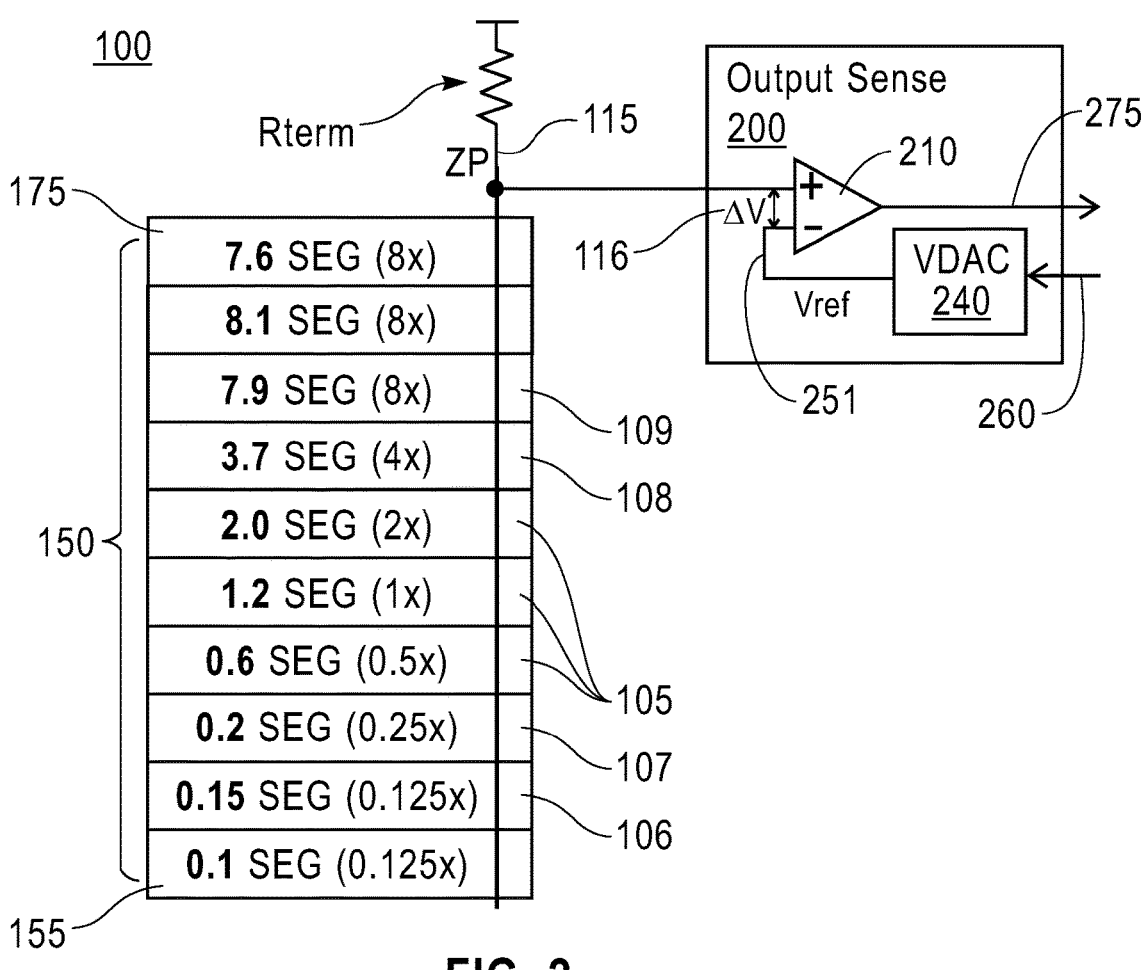
FIG. 2 illustrates examples of mismatched values of the output current of each of the DAC segments that are activated to contribute to the single-ended output signal ZP of the DAC device of FIG. 1 and details of the output sensing circuit when sensing the single-ended output ZP.
FIG. 3 conceptually illustrates, at a high level, a calibrating method that relies upon relative calibration of equal segments, without using any absolute references according to an embodiment.

As shown in FIG. 1, each digital bit input of an input code is received at a corresponding DAC segment 105, each corresponding segment having associated circuitry for converting its corresponding input bit into a different output signal value, i.e., a current signal. In voltage mode operation, the DAC output current signal, through termination resistors, Rterm, that are connected to each of the ZP, ZN output rail lines and form part of the TX device, is converted into a corresponding voltage signal that can be measured for comparison at the comparator. Thus, a DAC output value corresponding to a digital input code can be an analog value corresponding to an output of a single DAC segment 105 or a value corresponding to an output of a combination of DAC segments 105. As an example, shown in FIG. 2, DAC segment labeled 106 includes circuitry that when activated provides a nominal output current of 125 microamperes, while a segment labeled 109 can provide a nominal output current of 8 milliamps (mA). Such an output is generated as a current (or output voltage through the Rterm resistor) on a single conductive output rail line 115 (labeled ZP) as shown in FIG. 2, or DAC differential output rail lines labeled line ZP 115A and line ZN 115B as shown in FIG. 1. For non-limiting illustrative purposes of discussion, it is assumed that the DAC output signal is a voltage over an output resistor (not shown). In the 8-bit DAC embodiment 100 shown in FIG. 1, an output sense circuit 200 can measure the output analog voltages at output rail lines ZP and ZN and using control logic 250 can control calibration circuit 300 to responsively generate one or more calibration signal(s) 305 used to tune (e.g., strengthen or weaken) a segment(s) 105 corresponding to a particular bit(s). For the example 8-bit DAC 100 of FIG. 1, the generated calibration signals 305 include signals CAL<−1>, CAL<0>, . . . , CAL<8> which can be fed back into the DAC 100 to tune or adjust the circuit corresponding to the respective individual DAC segment 105 corresponding to respective input bits D<−1>, D<0>, . . . , Dt<8> in order to remove any non-linearity (due to improved matching) and increase precision.

A differential non-linearity (DNL) characterizes the non-ideality of the difference between two successive voltage levels that a DAC produces due to a mismatch of DAC segments 105. This non-linearity can alternatively be represented as a maximum deviation of the output steps from an ideal analog LSB value.

FIG. 2 illustrates examples of mismatched values 150 of output currents of each of the DAC segments 105 that are activated to contribute to the single-ended output signal ZP of the DAC device 100 of FIG. 1 and details of the output sensing circuit when sensing the single-ended output ZP. As shown in FIG. 2, for the example 8-bit DAC 100, it is seen that for LSB input bit D<0>, the corresponding DAC segment 106 produces a relative output signal strength of 0.15 instead of the nominal value of 0.125 (e.g., 0.125 mA). However, due to circuit or random variations for the next input bit D<1> the corresponding DAC segment 107 produces a relative output signal strength of 0.2 (instead of the nominal value of 0.25 mA), which is not double the value as would be expected for a perfectly linear binary DAC where the strength of each successive bit value is two times the previous bit strength. Similarly, due to circuit or random variations, it is seen that for input bit D<5>, the corresponding DAC segment 108 produces a relative output signal strength of 3.7 (instead of the nominal value of 4.0), which is not quite double the value of the binary DAC output voltage of the prior segment corresponding to prior bit D<4>, which produces a relative output signal strength of 2.0. Further, for the next MSB input bit Dt<6>, the corresponding DAC segment 109 produces a relative output signal strength of 7.9 (instead of the nominal value of 8.0), which due to circuit or random variations is not double the value of the DAC output voltage of prior bit D<5> as would be expected for a perfectly linear binary DAC. Note that those relative output signal strength values generated by the DAC segments are illustrative only. In a practical embodiment in a modern CMOS process, the single-ended LSB D<0> output signal voltage value can be on the order of 1.75 mV and the single-ended value of the bit Dt<8> is 112.5 mV, resulting in a full output swing of 450 mV single-ended, or 900 mV differential.

If not compensated, these variations cause a non-linearity in the output of the DAC and degrade the performance of the high-speed wireline TX (e.g., 112 Gsamples/sec). This calibration method can be implemented on-chip and does not impact the high-speed performance of the DAC. For example, with the values illustrated in FIG. 4A, the real relative signal strength value at code 1 is 0.15 and is 0.2 at code 2. Hence the DNL between codes 1 and 2 is computed as (0.2–0.15)–(0.25–0.125)=–0.075. It can also be expressed as a fraction of a LSB –0.075/0.125=–0.6 LSB.

Referring back to FIG. 1, in the exemplary embodiment, the calibration circuit 300, under control of control logic circuitry 250, responds to the sensed output signal voltages generated by one or more combinations of DAC segments and provides feedback signals 305 for adjusting the DAC segment(s) to correct the segment output currents and thereby eliminate any non-linearity. That is, the calibration signals generated by the calibration method, adjust each of the segments to ensure, in the case of a binary DAC, that each successive bit output is exactly a factor of two times the output of its immediately prior bit. The techniques employed further can adjust for any thermometer bit segments to correctly compensate for any mismatch of equal sized thermometer bits as well.

An approach implemented by calibration circuit 300 is to compensate random mismatch between segments to reduce the DAC DNL. As conceptually shown in FIG. 3, at a high level, a calibrating method is introduced that relies upon relative calibration of equal segments, without using any absolute references according to an embodiment. That is, to calibrate each of the DAC segments, a relative approach involves comparing and calibrating between equal DAC segments or equal groups of segments without reliance upon any reference or standard voltage. For example, a first binary DAC segment 205 is found to nominally output a signal of strength 2 which is, for example, an output current converted into a voltage output through a resistor (not shown). This segment's nominal strength value of 2 is compared to a second binary DAC segment 206 that is nominally of strength 1 (e.g., a converted voltage value through the output resistor); however, due to component variations, its strength has a value of 1.1, which is a mismatch and not a 2:1 binary ratio. The approach includes adding a third bit segment 207 of nominal strength 1, which can correspond to the DAC calibration spare segment 103 of FIG. 1 corresponding to the spare bit D<–1>. However, in the example shown, because of variations, the strength of the segment corresponding to this added bit is found to be 0.8 (e.g., voltage through the same output resistor) which is not a 2:1 ratio as desired. The approach includes, at 210, turning on the DAC input bits corresponding to segments 206, 207 together and scale them, i.e., calibrate using calibration circuitry 300, so the combination equals or matches the strength of the first binary DAC segment 205 of signal strength value 2 which is a 1:1 comparison. For example, a calibration step can include adjusting (strengthening) the second binary DAC segment 206 to equal a signal strength value 1.16 and adjusting the third DAC segment 207 to have a signal strength value 0.84. At the next step of the calibration, the approach 211 includes turning on the DAC input bits corresponding to segments 206 and 207 one at a time, so that their strengths can be compared with each other. The stronger of segments 206 and 207 can be weakened, and the weaker of segments 206 and 207 can be strengthened until their strengths are equal. By making the strengthening of one segment equal in magnitude to the weakening of the other, one can ensure that the sum of their strengths remains equal to the strength of the first binary DAC segment 205. Eventually both binary DAC segments 206 and 207 are adjusted so that they each output a relative signal strength of 1, which is the correct 2:1 binary ratio when compared to the first binary DAC segment 205 of relative strength 2. The order of comparison may be interchanged such that the relative strengths of each of the second DAC segment 206 and the third DAC segment 207 may be matched first, i.e., tuned so their strengths are equal to each other, and then these can be matched or scaled to match the first binary DAC segment 205.

Referring back to FIG. 2, in the exemplary embodiment of a calibration approach for the example 8-bit DAC 100 shown in FIG. 1, the output sense circuit 200 senses the voltage at a DAC output rail line 115 (e.g., the ZP output rail). Sense circuitry 200 includes a voltage comparator 210 having a first input receiving the DAC output voltage at the rail (corresponding to an input code word) and a second input receiving a voltage reference Vref signal 251 generated by another auxiliary voltage DAC 240 receiving an input digital code 260. The auxiliary VDAC code 260 is generated by the control logic 250 based on signal 275 and calibration method described hereafter. Based on a voltage difference 116 (ΔV) comparison of a bit segment output voltage at a rail line 115 with the Vref voltage input at the comparator device 210, a comparator output 275 is generated that is input to the control logic circuit 250 associated with the calibration circuit 300 to provide corrective tuning of the corresponding DAC segment using calibration signals 305. As part of this calibration process, the voltage input code 260 to the VDAC is adjusted to obtain a matching of the Vref signal to the DAC segment(s) output. Since the output sense circuit 200 is only used to check whether the DAC output voltage due to one DAC segment (or a combination of DAC segments) is greater than or less than the DAC output voltage due to a different DAC segment (or a different combination of DAC segments), the output sense circuit 200 imposes no hard requirements on the linearity of VDAC 240 or the offset of comparator 210. To ensure accurate comparison, the only important requirement on VDAC 240 is fine resolution (small step size).

FIGS. 4A-4J describe a top-down relative matching approach 400 to DAC calibration for the 8-bit DAC 100 of FIG. 1 according to an embodiment. In the embodiment, the DAC calibration is first performed by measuring DAC outputs at a first differential output line e.g., ZN 115B and tuning the DAC segments accordingly, and then the DAC calibration is continued by measuring DAC outputs at the second differential output line e.g., ZP 115A and tuning the DAC segments accordingly. For purposes of illustration, the DAC top-down relative matching calibration approach 400 is illustrated for a single DAC output line, i.e., ZP line 115. In the approach illustrated in FIGS. 4A-4J, a "matching" or "equal" strength of a quantity, e.g., voltage signals, can include a "substantially equal" strength, e.g., of measured voltage signals. As a non-limiting example, "substantially equal" would be "within an LSB" of the VDAC or a small difference between the voltage signals, e.g., within a +/−1 mV (millivolt) difference between measured voltage signals.

Figure 4A:
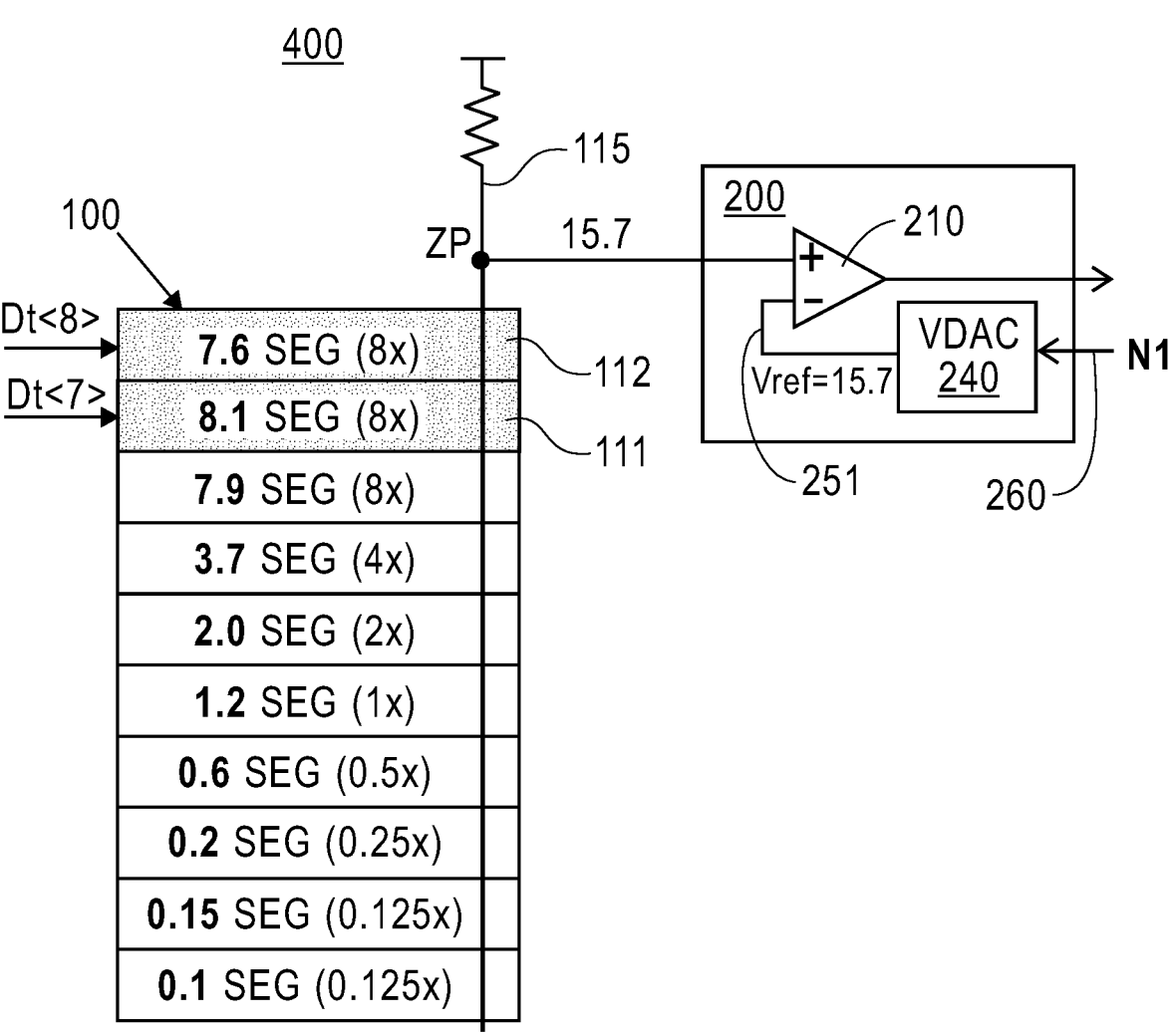
FIGS. 4A-4J describe a top-down relative matching approach to DAC calibration for an 8-bit DAC shown in FIG. 2 according to an embodiment.

In an embodiment of the top-down relative matching DAC calibration approach, as shown in FIG. 4A, a first step activates (i.e., turns on) those bits corresponding to one half the DAC output. In the example 8-bit DAC 100 shown in FIG. 4A, this is an output voltage produced by turning on two DAC segments 111 and 112 corresponding to the upper (MSB) thermometer bits Dt<7> and Dt<8>, corresponding to DAC input code 1100000000. As shown, the corresponding segment 111 produces an output relative strength value of 8.1 and segment 112 produces an output relative strength value of 7.6 which is a mismatch due to variations as the nominal output strength of each segment should be 8 (e.g., 8 milliamps) and the combined strength should nominally be equal to 16. The combined output current at output line 115 for these two segments is of a strength 15.7 due to variations. Then, as a next step, an input code word 260 labeled N1 is input to the VDAC 240 and is tuned to a value so that the VDAC output can provide a corresponding Vref signal output 251 of a strength that reaches a comparator trigger point, i.e., equal to the combined strength of these two segments (e.g., 15.7). The comparator trigger point is reached when N1 is tuned so that the VDAC produces Vref=ZP, i.e., Vref 251 equals the DAC output voltage (e.g., 15.7) and once this point is reached, the comparator output is flipped. At this point, the value of the input code N1 to achieve this trigger is recorded/saved. To achieve this Vref signal matching, the VDAC 240 is of at least of equal to or greater resolution than the DAC being calibrated, e.g., a 10-bit or 11-bit DAC resolution, to achieve step sizes that can match signal strength levels for the comparisons.

Figure 4B:
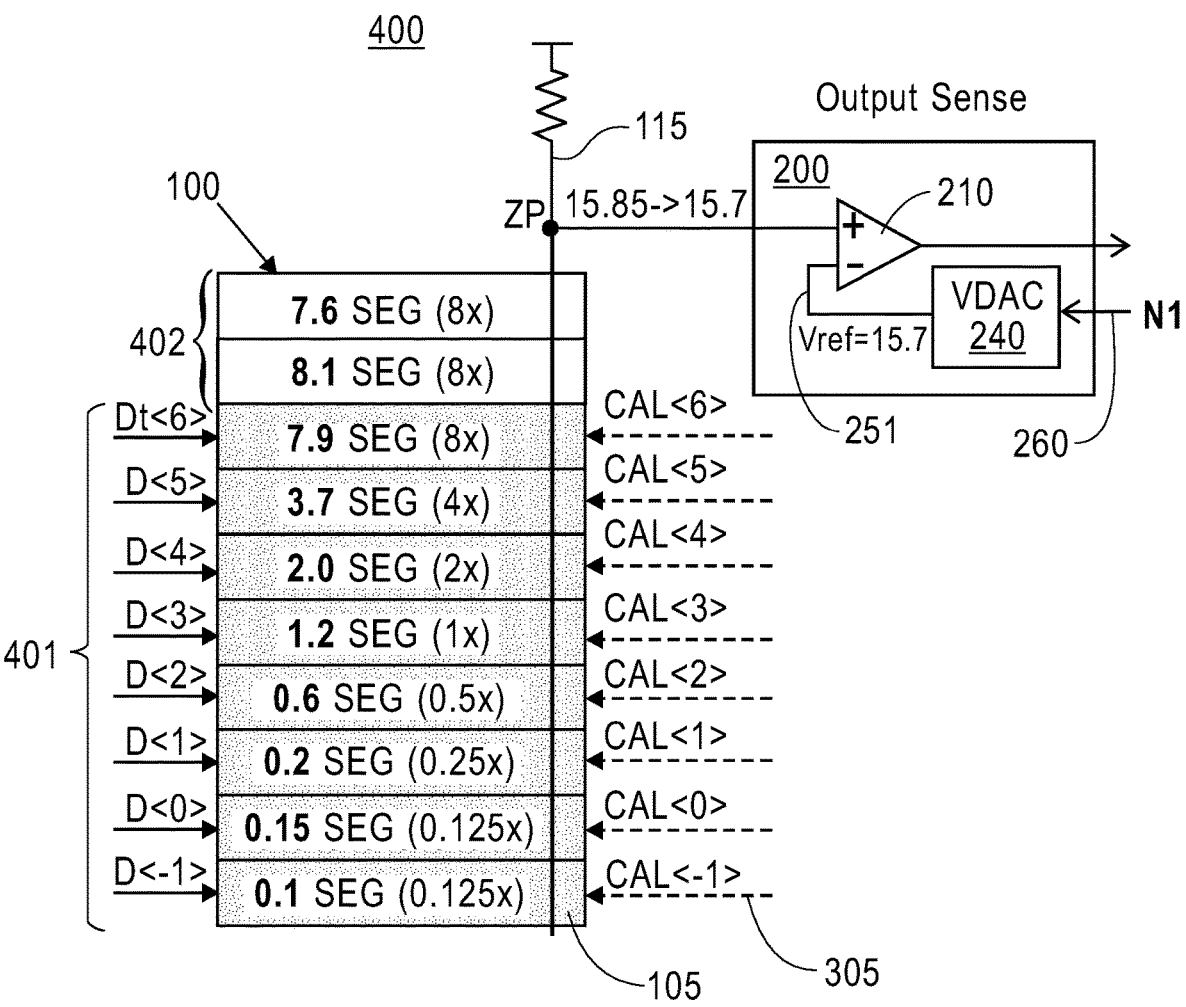

Then, in the top-down relative matching DAC calibration approach, as shown in FIG. 4B, a second step activates (i.e., turns on) those bits corresponding to the bottom half of the DAC output. In the example 8-bit DAC 100 shown in FIG. 4B, this is an output voltage produced by turning on DAC segments 105 corresponding to the input bits D<−1>, D<0>, . . . , Dt<6>, corresponding to DAC input code 0011111111. As shown, the segments 105 corresponding to these activated bits produce a combined output strength totaling 15.85 which is a mismatch due to random variations as the nominal output strength of these segments should total 16 (e.g., 16 milliamps) and the combined strength should nominally be equal to 16. Then, as a next step, the saved input code word 260 (N1) is input to the VDAC 240 that tunes the Vref value 251 to equal the upper half strength 15.7.

Figure 6A:
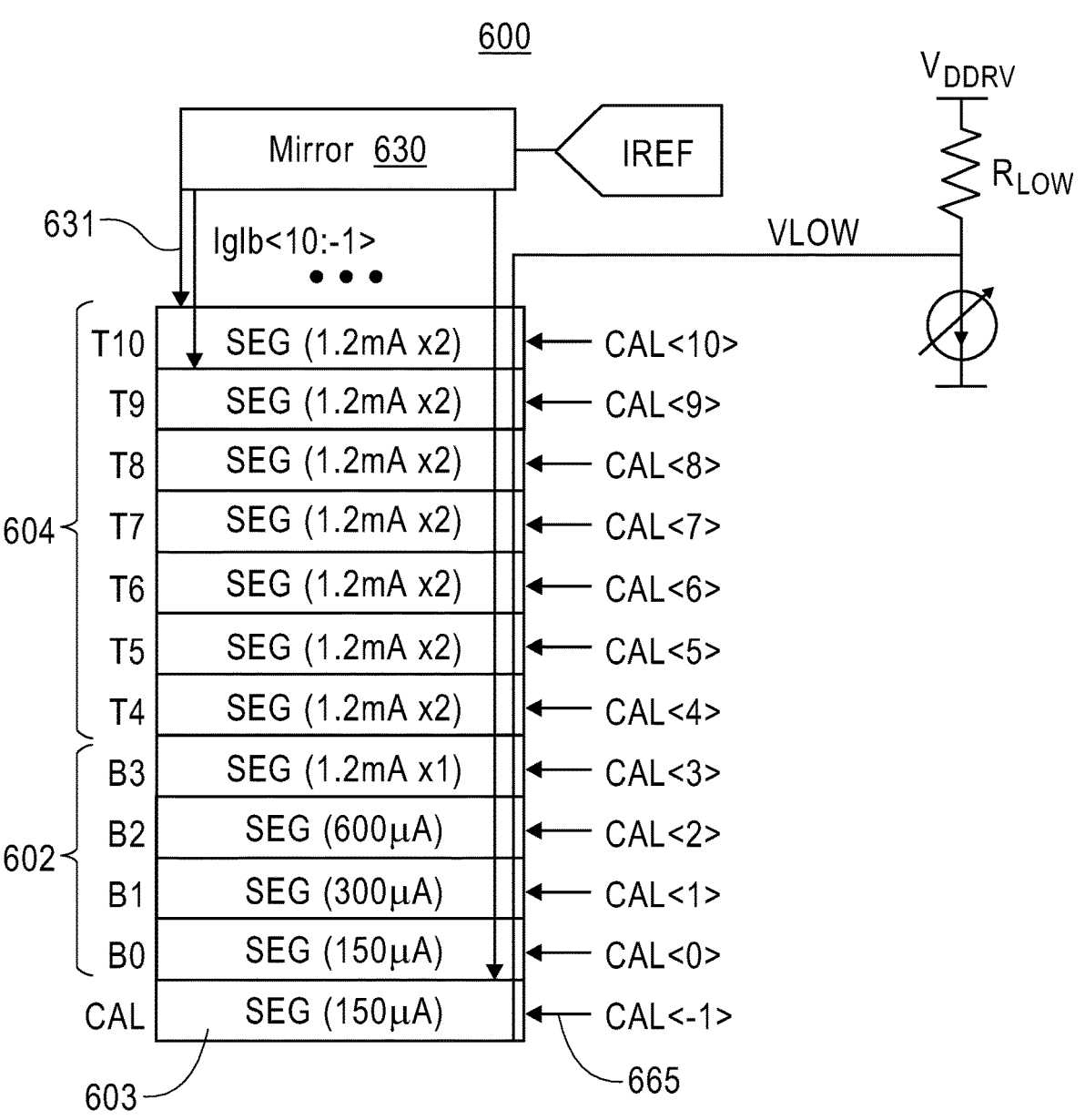
FIG. 6A illustrates an example embodiment of a 7-bit current mode logic (CML) DAC and FIG. 6B shows additional calibration and main segment driver circuitry used to provide the per-segment strength adjustment.
Figure 6B:
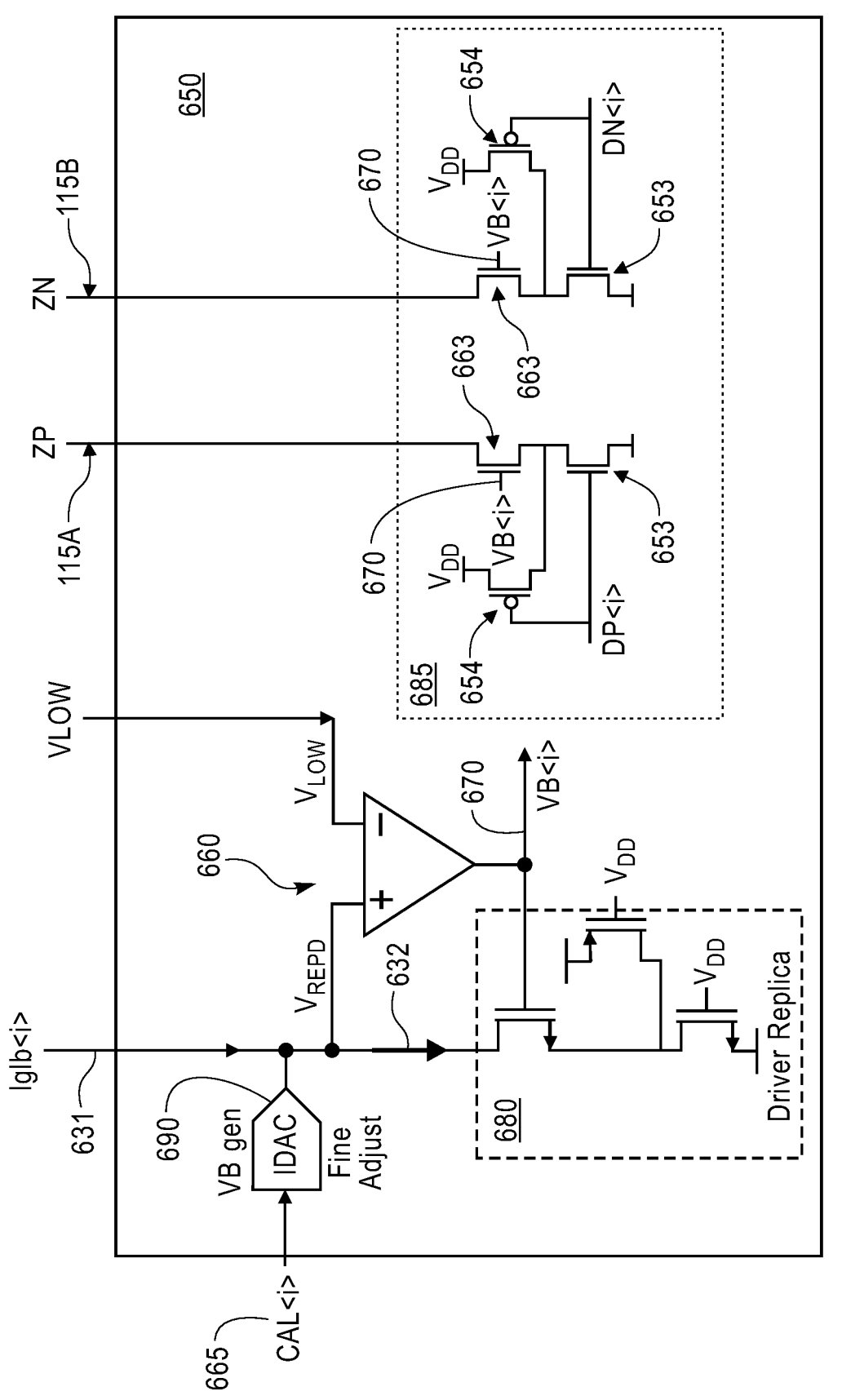

Then, as a next step, using the control logic 250 and calibration signals CAL<−1>, CAL<0>, . . . , CAL <6> from calibration circuitry 300, the strength of each of the bottom half DAC segments 105 corresponding to the input bits D<−1>, D<0>, . . . , Dt<6> is tuned, i.e., multiplied by a multiplication factor "a", until the comparator triggers, i.e., until the combined output strength of all these bottom half segments 401 totals 15.7 which is equal to the combined output strength value 15.7 of the upper bit segments 402 as produced by the output sense VDAC 240 responsive to the saved code word 260. In an embodiment, the calibration circuit 300 sweeps through values for multiplication factor α to adjust each of the DAC 100 bottom half segment's 401 current output settings until ZP=Vref. In some embodiments, the calibration circuitry 300 includes for each DAC segment i an input received from the control logic 250 which represents the strength of the segment and circuitry to convert this input into a control signal to the segment CAL<i>; for example, the control signal CAL<i> can be a digital word which is converted by an internal DAC inside the DAC segment i into an analog bias voltage or current that sets the current output level of that segment. FIGS. 6A and 6B thereafter provide more details of such an embodiment. The factor α is applied by the control logic 250 to multiply the values of the digital controls sent to the calibration circuitry 300, which then adjusts calibration signals CAL<−1>, CAL <0>, . . . , CAL <6> accordingly. In this example embodiment shown, this a factor would have a value α=15.7/15.85.

Figure 4C:
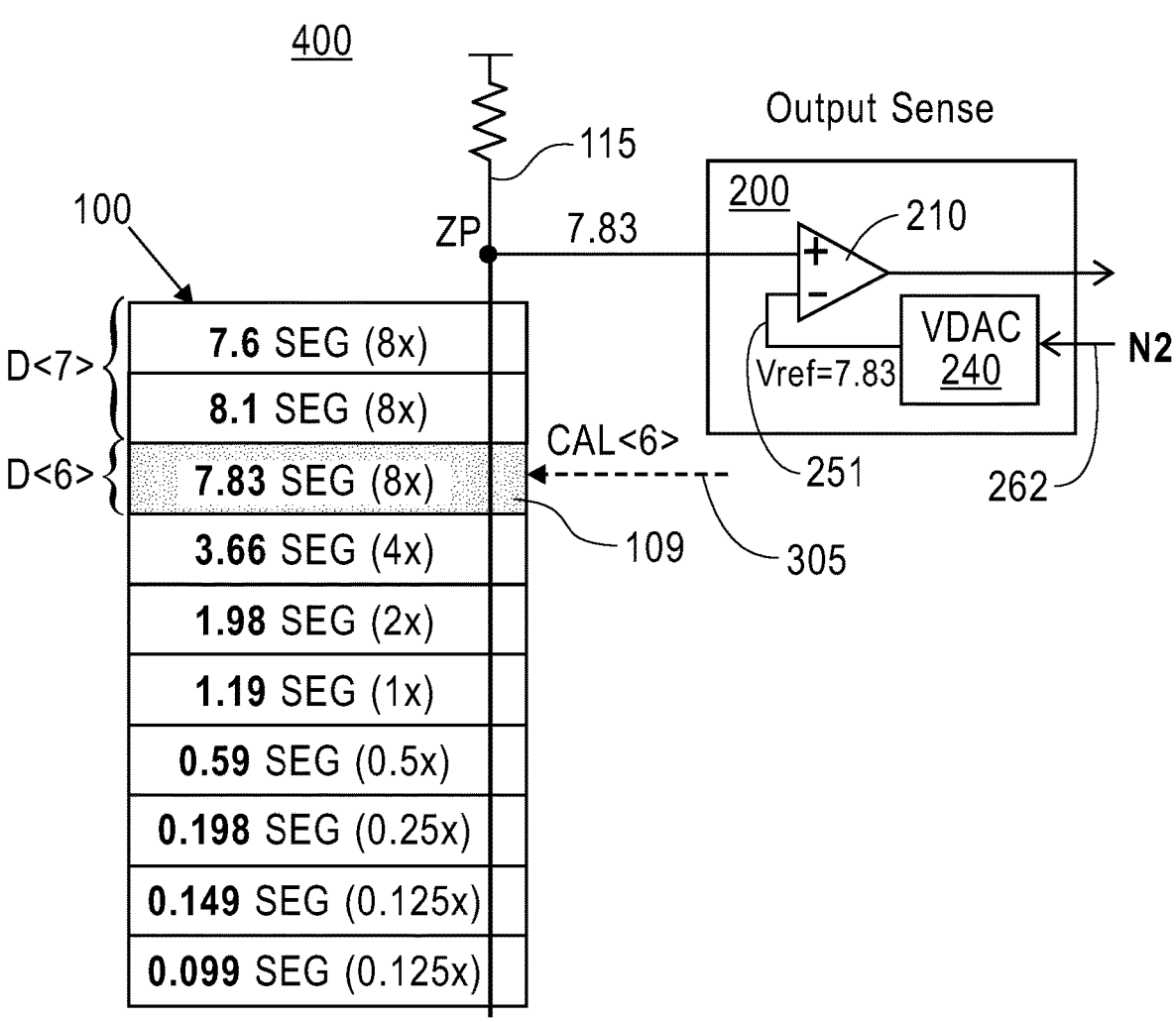

For the example 8-bit DAC, having matched the combined strength of the top half DAC segments corresponding to DAC input bit D<7> (=two thermometer bits Dt<7> and Dt<8>) with the bottom half DAC segments for bits D<−1>, D<0>, . . . , Dt<6>, the method continues as shown in FIG. 4C, where a next step involves activating (i.e., turning on) the next MSB bit which in this example corresponds to input bit Dt<6> (shown in FIG. 4C as bit D<6>) corresponding to DAC input code 0010000000. As shown, the corresponding segment 109 produces an output of strength 7.83 which is a mismatch due to variations as the nominal output strength of this segment should be 8 (e.g., 8 milliamps). Then, as a next step, an input code word 262 labeled N2 is input to the VDAC 240 and is tuned to a value so that the VDAC output matches the voltage on rail line ZP 115, i.e., can provide a corresponding Vref signal output 251 of a strength that reaches the comparator trigger point, i.e., equal to the strength of the D<6> segment, e.g., 7.83. At this point, the value of the input code N2 to achieve this trigger is recorded/ saved in a local memory device (not shown).

Figure 4D:
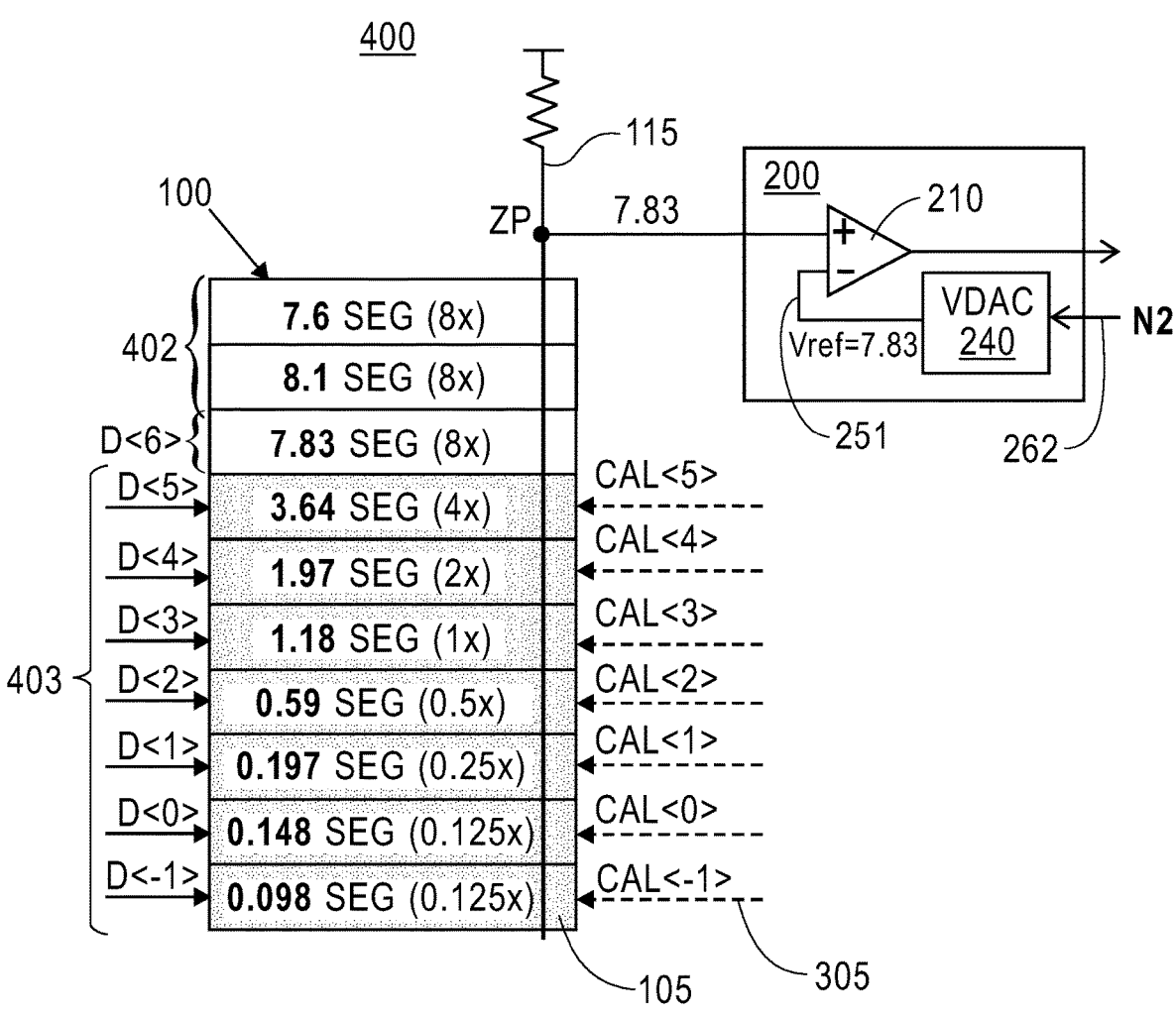
Figure 4E:
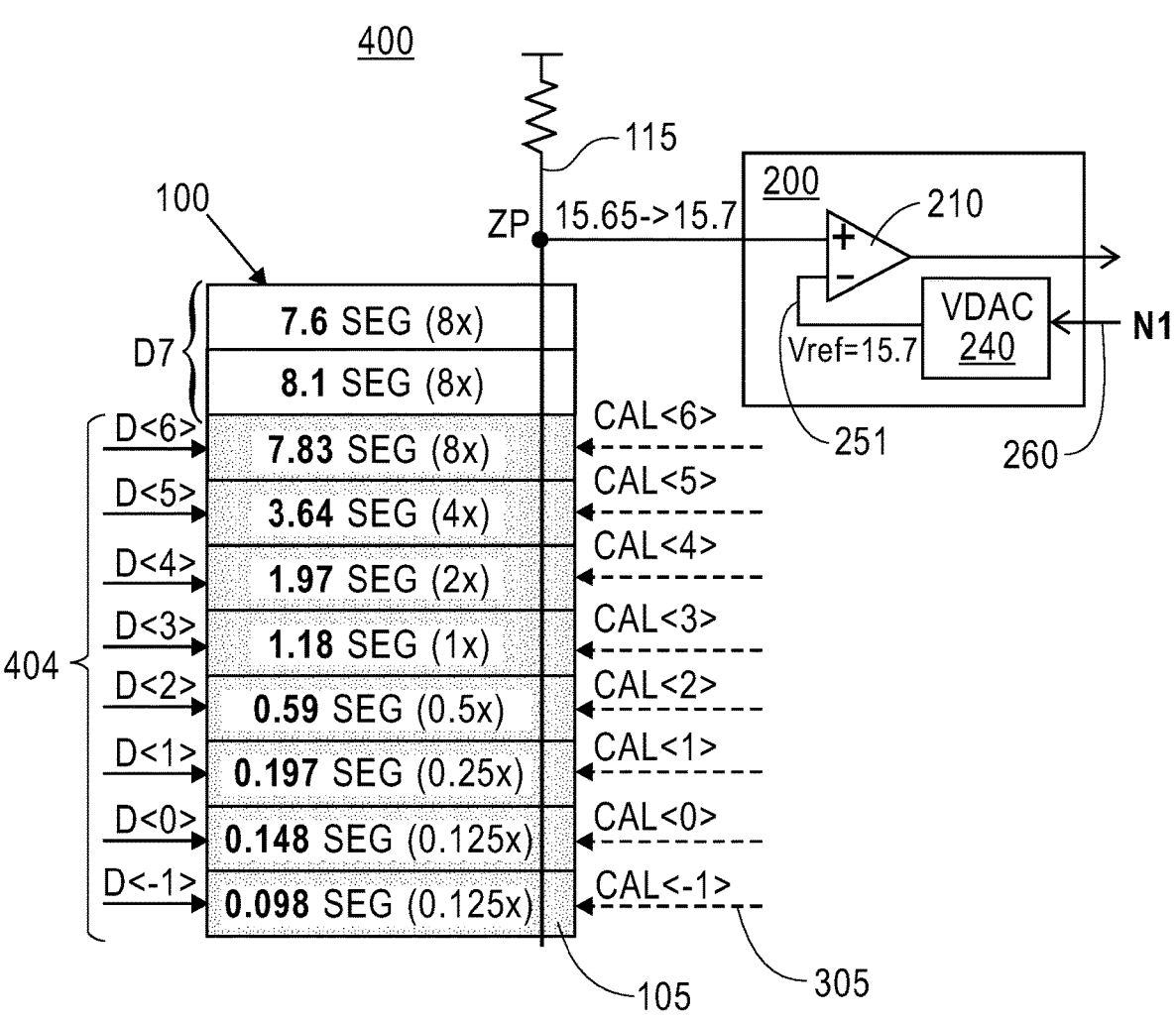

Then, in the top-down relative matching DAC calibration approach, as shown in FIG. 4D, a next step activates (i.e., turns on) those bits corresponding to the bottom one-quarter (¼) of the DAC output. In the example 8-bit DAC 100 shown in FIG. 4D, this is an output voltage produced by turning on DAC segments 105 corresponding to the input bits D<−1>, D<0>, . . . , D<5>, corresponding to DAC input code 0001111111. As shown, the segments 105 corresponding to these activated bits 403 produce a combined output strength which may be adjusted until the combined output of the DAC 100 segments equals the VDAC 240 output value 251, i.e., ZP=Vref. That is, the calibration circuit 300 sweeps through values for a multiplication factor α to adjust each activated DAC 100 segment's current output setting until ZP=Vref. The adjustment to strengthen (or weaken) the DAC segment output is made to the circuitry associated with that DAC segment, e.g., such as by increasing (or decreasing) a current out of an associated current source. Sweeping through this multiplication factor α ensures that the combined DAC output for bottom one-quarter DAC input bits D<−1>, D<0>, . . . , D<5> totals 7.83, which indicates no mismatch with respect to the actual output strength of the DAC segment corresponding to input bit D<6>.

However, while the combined output strength of the bottom one-quarter DAC input bits D<−1>. D<0>, . . . , D<5> is now equal to the output strength of bit D<6>, it is determined that, at this point, the combined output strength of DAC segments corresponding to activated input bits D<−1>+D<0>+ . . . +D<6>≈15.65 does not equal the combined strength of the segments corresponding to the activated DAC upper half bits D<7> 402 (a strength of 15.7). Thus, a next step corrects for this mismatch by processing shown in FIG. 4E which depicts the steps of re-setting the VDAC 240 with the input code 260 corresponding to the original value N1 to obtain the 15.7 Vref voltage as the comparator Vref signal 251 and then activating DAC input bits D<−1>, D<0>, . . . , D<6> by inputting a corresponding DAC input code 0011111111 to obtain a new combined segment voltage output at ZP rail line 115. As shown, the combined output strength corresponding to activated DAC input bits D<−1>, D<0>, . . . , D<6> is initially of a strength 15.65 indicating a mismatch with the combined output strength of the segments for MSB bit D<7> 402.

Figure 4F:
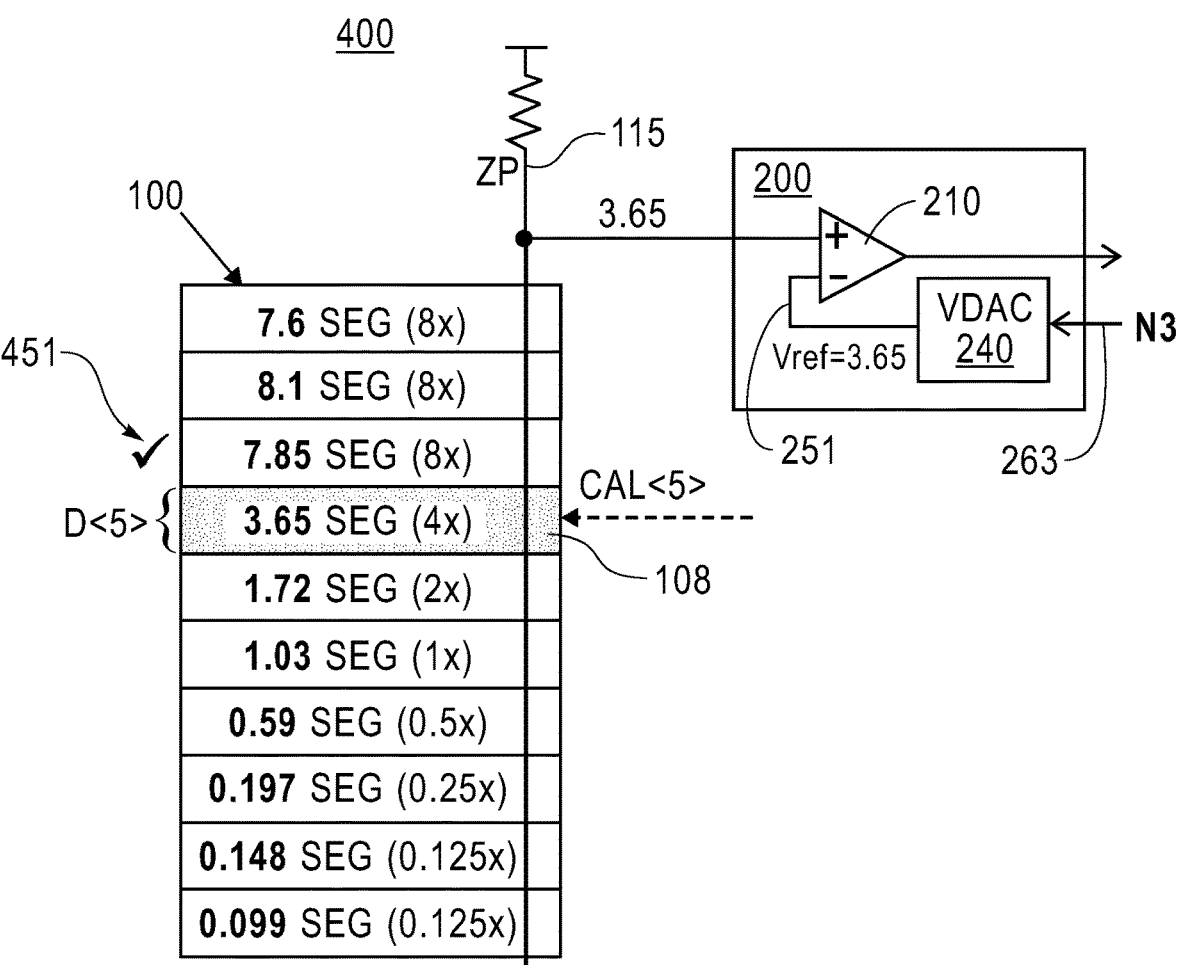

As shown, the segments 105 corresponding to these activated bits 404 produce a combined output strength which is adjusted (tuned using a multiplication factor α) until the combined output of the DAC 100 segments equals the VDAC 240 output value 251, i.e., ZP=Vref. That is, the calibration circuit 300 sweeps through values for a multiplication factor α to adjust and tune each activated DAC 100 segment's current setting until the combined output signal strength at ZP=Vref. The adjustment to strengthen the DAC segment output is made to the circuitry associated with that DAC segment, e.g., such as by increasing a current out of an associated current source. Sweeping through this multiplication factor α for tuning all the activated segments ensures that the combined DAC output for these DAC input bits D<−1>, D<0>, . . . , D<6>404 totals 15.7, which indicates no mismatch with respect to the actual combined output strength of the DAC segments corresponding to input bit D<7> (=thermometer bits Dt<7> and Dt<8>) as prior determined. Thus, at this point, the segment output strength for input bit D<7>=2×output strength of DAC segment D<6>=2×output strength of DAC segments (D<5>+ D<4>+ . . . +D<−1>). The successful tuning and matching of the DAC segment corresponding to input data bit D<6> in this manner is recorded and stored in an associated memory device (not shown) as indicated by the checkmark 451 as shown in FIG. 4F.

This process continues for each successive bit in the top-down relative matching DAC calibration approach. Thus, as shown in FIG. 4F, a next step involves activating (i.e., turning on) the next MSB bit which in this example corresponds to input bit D<5> corresponding to DAC input code 0001000000. As shown, the corresponding segment 108 produces a relative output signal strength of 3.65. Then, as a next step, an input code word 263 labeled N3 is input to the VDAC 240 and is tuned to a value so that the VDAC output matches the voltage on rail line ZP 115, i.e., can provide a corresponding Vref signal output 251 of a strength that reaches the comparator trigger point, i.e., equal to the strength of the D<5> segment, e.g., 3.65. At this point, the value of the input code N3 263 to achieve this trigger is recorded/saved.

Figure 4G:
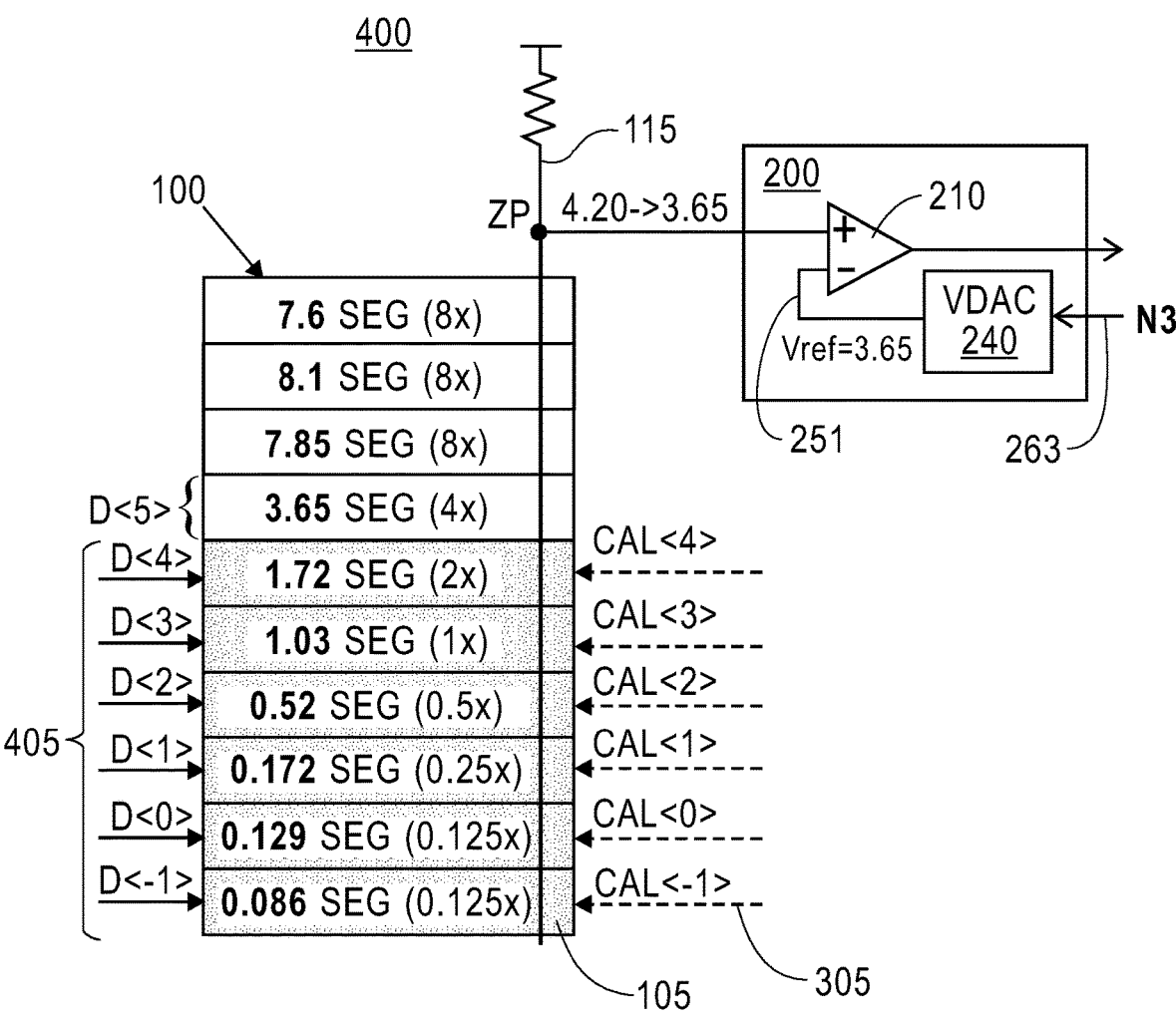
Figure 4H:
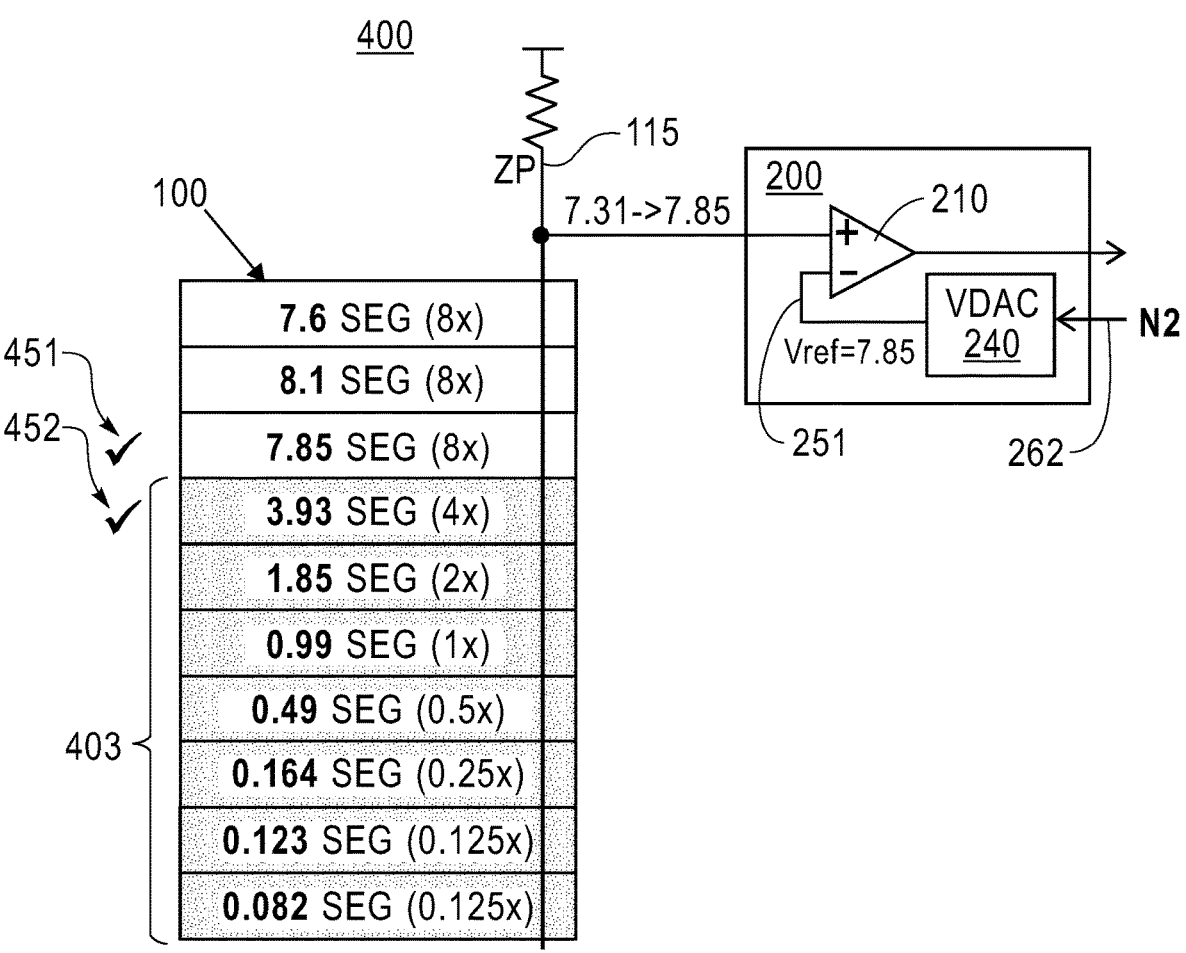
Figure 4I:
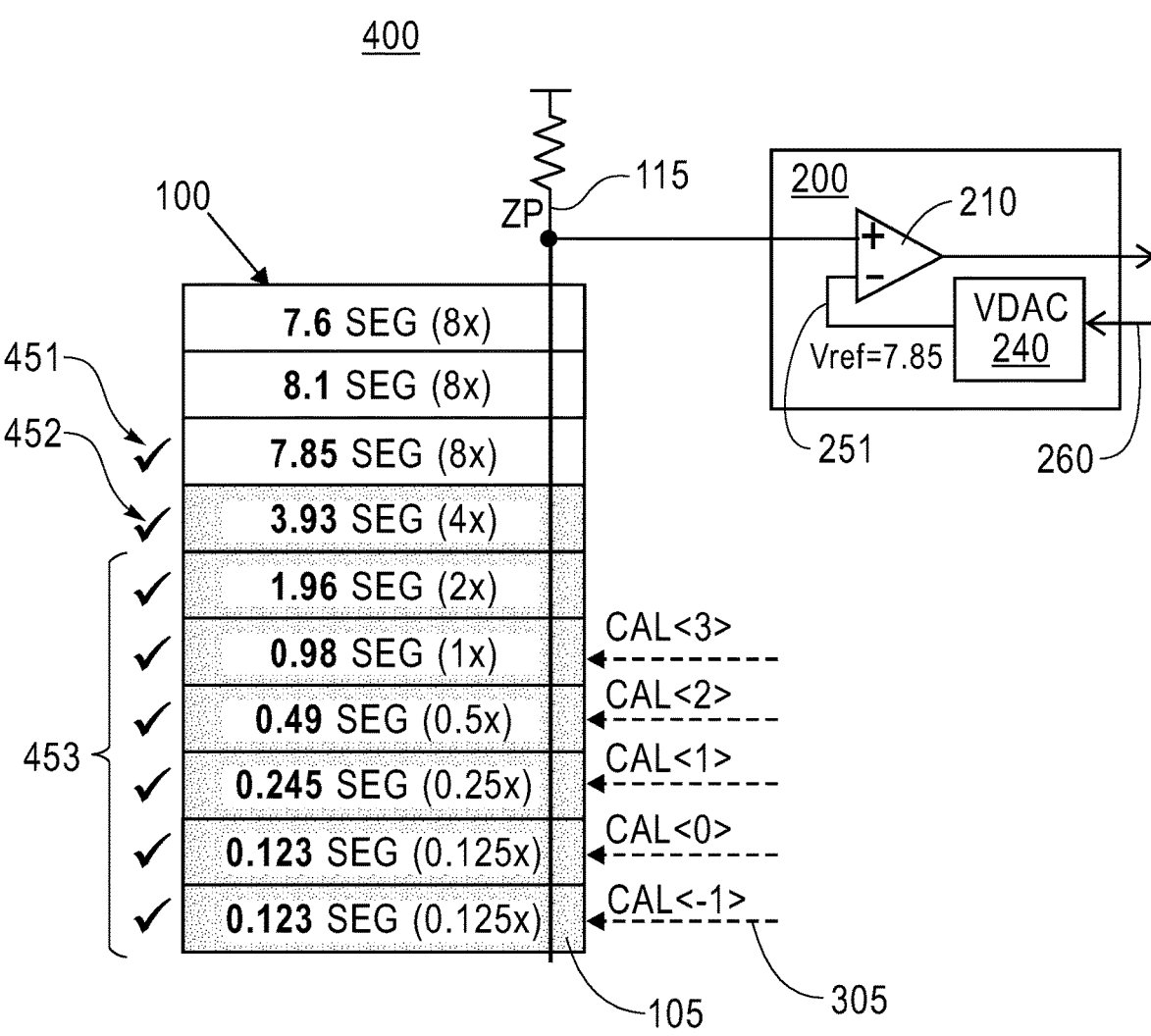
Figure 4J:
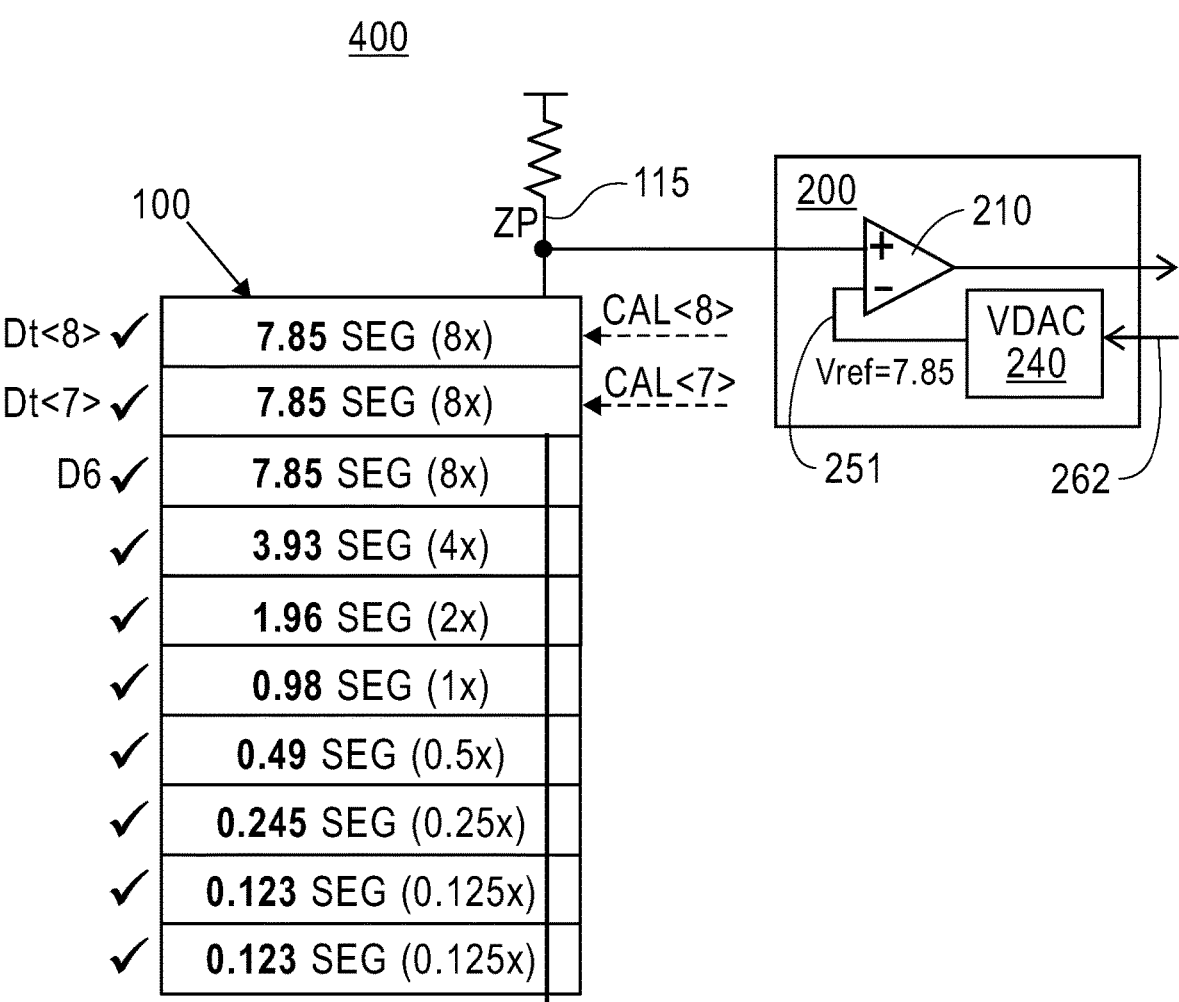

Then, in the top-down relative matching DAC calibration approach, as shown in FIG. 4G, a next step activates (i.e., turns on) those remaining lower bits D<−1>, D<0>, . . . , D<4>405 corresponding to DAC input code 0000111111. As shown, the segments 105 corresponding to these activated bits 405 produce a combined output strength of 4.20 which is a mismatch due to variations as the combined output strength of these segments should be 3.65, which may be adjusted using calibration circuit 300 until the combined output of the DAC 100 segments corresponding to these bits D<−1>, D<0>, . . . a, D<4> 405 equals the VDAC 240 output value 251, i.e., ZP=Vref=3.65. That is, the calibration circuit 300 sweeps through values for a multiplication factor α to adjust each activated DAC 100 segment's current output setting via respective calibration signals CAL<−1>, CAL<0>, . . . , CAL<4> until ZP=Vref. In this example, the adjustment is made to weaken each of the DAC segments by tuning the internal circuitry associated with that DAC segment, e.g., such as by decreasing a current out of an associated current source. Sweeping through this multiplication factor α ensures that the combined DAC output for these DAC input bits D<−1>, D<0>, . . . , D<4> is reduced from 4.20 to 3.65 which should trigger a flip of the output sense comparator 210 indicating a match as the combined output strength of these calibrated segments will equal the output strength of the DAC segment corresponding to input bit D<5> which equals 3.65.

However, while the combined output strength of the DAC input bits D<−1>, D<0>, . . . , D<4> is now equal to the output strength of bit D<5>, it is determined that, at this point, whether the combined output strength of DAC segments corresponding to activated input bits D<−1>+ D<0>+ . . . +D<5>≈7.31 matches (e.g., equals or not) the output strength of the DAC segment corresponding to an activated DAC bit D<6> (e.g., a strength of 7.85). Thus, a next step corrects for this mismatch by processing shown in FIG. 4H which depicts the steps of re-setting the VDAC 240 with the input code 262 corresponding to the value N2 to obtain the 7.85 Vref voltage as the comparator Vref signal 251 and then activating DAC input bits D<−1>, D<0>, . . . , D<5> by inputting a corresponding DAC input code 0001111111 to obtain a new combined voltage output at ZP rail line 115. As shown, the combined output strength corresponding to activated DAC input bits D<−1>, D<0>, . . . , D<5> 403 is initially of a strength 7.31 indicating a mismatch with the output strength of the segment for bit D<6> (=7.85).

As shown, the segments 105 corresponding to these activated bits 403 produce a combined output strength which is adjusted (tuned using a multiplication factor α) until the combined output of the DAC 100 segments equals the VDAC 240 output value 251, i.e., ZP=Vref. That is, the calibration circuit 300 sweeps through values for a multiplication factor α to adjust and tune each activated DAC 100 segment's current output setting until ZP=Vref. The adjustment to strengthen the DAC segment output is made to the circuitry associated with that DAC segment, e.g., such as by increasing a current out of an associated current source. Sweeping through this multiplication factor α for tuning all the activated segments ensures that the combined DAC output for these DAC input bits D<−1>, D<0>, . . . , D<5> 403 totals 7.85 which indicates no mismatch with respect to the actual (previously calibrated) output strength of the DAC segment corresponding to input bit D<6> as prior determined. Thus, at this point, the segment output strength for input bit D<6>=2×output strength of DAC segment D<5>=2×output strength of DAC segments (D<4>+ D<3>+ . . . +D<-1>). The successful tuning and matching of the DAC segment corresponding to input data bit D<5> in this manner is recorded and stored in memory as indicated by the checkmark 452.

The process steps described with respect to FIGS. 4C-4H are repeated for the rest of the binary bit segments of the DAC 100. That is, next processing steps of the method include in succession, tuning remaining bit DAC segments D<x>, where in the example shown in FIGS. 4C-4H, x=4, 3, 2, 1, 0 and −1. The successive tuning of the remaining bit DAC segments D<x> includes measuring the strength (e.g., output current or voltage) of the next MSB (e.g., D<x>), setting the input code word Nx of the VDAC 240 to a code word value that will achieve a flipping of the comparator and recording/storing the code word Nx used to achieve that strength value. This code word Nx corresponds to a Vref value that will ensure ZP=Vref. Then, the method includes tuning the strengths of the combined remaining bits starting from D<x-1>, D<x-2>, . . . , D<0>, D<-1>, i.e., activating (turning on) the bits starting from D<x-1>, D<x-2>, D<0>, D<-1> and setting Vref value to the value corresponding to the stored Nx value corresponding to the bit D<x>. Then a determination is made as to whether the total combined strength of binary DAC segments corresponding to these bits D<x-1>, D<x-2>, . . . , D<0>, D<-1> at output line rail ZP is equal to the Vref value corresponding to the bit D<x> as set by code word Nx. If these values are not equal, then a multiplication factor α is applied to the circuit segments corresponding to each of the input bits D<x-1>, D<x-2>, . . . , D<0>, D<-1> to tune these DAC segments, i.e., modify the internal DAC current sources, to strengthen or weaken the output current produced by each DAC segment until a combined output of these DAC segments as measured at line ZP equals the VDAC 240 output value 251. i.e., ZP=Vref. That is, using respective calibration signals CAL<x-1>, CAL<x-2>, . . . , CAL<0>, CAL<-1>, the calibration circuit 300 sweeps through values for a multiplication factor α to adjust and tune each activated DAC 100 segment's current output setting until ZP=Vref. After tuning the DAC segment output strengths corresponding to these bits D<x-1>, D<x-2>, . . . , D<0>, D<-1> using multiplication factor α to match the output strength of the DAC segment corresponding to bit D<x>, the method continues to match the combined output signal strength of DAC segments corresponding to bits D<x>, D<x-1>, D<x-2>, . . . , D<0>, D<-1> to the tuned strength of the DAC segment corresponding to the prior MSB, i.e., bit D<x+1>, which corresponds to a Vref value output of the VDAC 240 as set by the prior stored code word value Nx used to achieve that strength. That is, bits D<x>, D<x-1>, D<x-2>, . . . , D<0>, D<-1> are activated, and the combined output strength of the DAC segments (equal to a sum of the output values of these bits D<X>+D<x-1>+D<x-2>+ . . . +D<0>+D<-1>) on output rail line ZP are compared to the Vref value corresponding to bit D<x+1> as set by the VDAC code word for that bit D<x+1>. Depending upon the difference, the internal segments of each of these DAC segments corresponding to bits D<x>, D<x-1>, D<x-2>, . . . , D<0>, D<-1> are tuned by sweeping calibration circuit 300 for a new multiplication factor value α that can achieve ZP=Vref. Once the combined output value corresponding to bits D<x>, D<x-1>, D<x-2>, . . . , D<0>, D<-1> matches the output value of the DAC segment corresponding to bit D<x+1>, then the bit D<x-1> is checked as being tuned. For the example 8-bit DAC 100 of FIG. 4I, this top-down relative matching approach is successively repeated for x=5, 4, 3, 2, 1, 0 and −1 with corresponding check marks 453 shown when the method completes for each of the remaining bits in succession.

Additional steps can include matching the thermometer DAC segments in 1:1 correspondence with each other. For example, using the methods of FIG. 4C, further steps shown in FIG. 4J entail the further measuring of an output DAC segment value corresponding to a MSB thermometer bit Dt<7> with the previously tuned bit D<6> and tuning it to matching its strength. That is, the strength of the DAC segment corresponding to activated thermometer bit Dt<7> at rail line ZP 115 is measured by output sense circuit 200 and the VDAC of output sense circuit 200 is set with input code word 262 to produce the Vref value 7.85 used in the tuning of D<6>. Using calibration signal CAL<7> from calibration circuit 300, the output strength of the DAC segment corresponding to Dt<7> is adjusted until the comparator flips which is when the output strength of the DAC segment signal corresponding to bit Dt<7> is equal to or matches the DAC segment output signal strength corresponding to bit D<6>. Similarly, using the methods of FIG. 4C, a further step entails measuring an output DAC value corresponding to a MSB thermometer bit Dt<8> with the previously tuned bit D<6> and matching its strength. That is, the strength of the DAC segment corresponding to activated thermometer bit Dt<8> at rail line ZP 115 is measured by output sense circuit 200 and the VDAC of output sense circuit 200 is set to the value Vref value used in the tuning of D<6>. Using calibration signal CAL<8> from calibration circuit 300, the output strength of the DAC segment corresponding to Dt<8> is adjusted until the comparator flips which is when the output strength of the DAC segment signal corresponding to bit Dt<8> is equal to or matches the DAC segment output signal strength corresponding to bit D<6>.

In an embodiment, these steps of tuning these thermometer bit DAC segments corresponding to thermometer bits Dt<7>. Dt<8> can be performed initially (at the beginning of the calibration) to match to each other and to match to the segment strength associated with bit D<6> and then proceed with the lower bits to ensure that they are a factor of 2 smaller (for accurate binary scaling). Further, by the time the calibration is finished, the spare compensating segment associated with spare bit D<-1> will be adjusted to have the same strength as the strength of the LSB.

In accordance with the embodiments depicted in FIGS. 4A-4I for the example 8-bit DAC 100, the top-down relative matching approach is successively repeated tuning the DAC segments however by measuring DAC output signals at the other differential output rail line ZN (115B as shown in FIG. 1).

With respect to the embodiments depicted in FIGS. 4A-4I, additional methods of compensation can be implemented to account for practical limitations of the calibration circuitry. These additional compensation methods can include, in a first instance, an issue of rounding up and down code, referring to code of internal DAC forming a DAC segment 105. This code is typically 6 bits per segment in a CML DAC design. In one embodiment, when code rounding happens, both up and down rounding can be tested. Further, in the iterative calibration scheme, the full calibration process can be repeated with finer adjustments. Also, an iterating process can further be performed on calibration steps e.g., when matching DAC segment strength of bit D<6> to combined DAC segment strengths of D<5>, . . . , D<-1> and then matching combined DAC segment strengths of bit D<6>, D<5> . . . D<-1> to segment strength of bit D<7>, a further step can include re-adjusting DAC segment strengths of bits D<6> and D<5>, . . . , D<-1> by +/-1 to ensure their matching.

In an embodiment, the calibration steps described in FIG. 4 apply to the single-ended calibration of the positive polarity of the DAC (sensing of ZP rail only). In the case of a differential DAC 100, both of the positive and negative polarities need to be calibrated. If the DAC 100 includes separate adjustment controls 305 for both polarities, then the negative polarity step can be repeated independently, sensing the output net ZN instead of ZP. If the DAC 100 only includes a single set of calibration signals 305 shared between positive and negative polarities of the DAC, then the calibration can be run on the positive polarity, giving a set of codes SetP (CAL<-1>, CAL<0.> . . . ), then run on the negative polarity, giving a second set of codes SetN. Finally, a set of codes equal to the average of the values of the two codes can be applied to both polarities for the final calibration. In another embodiment, the output sensing circuit 200 can be implemented with a differential comparator replacing the comparator 210 and directly performing the calibration steps sensing the value V(ZP)–V(ZN).

Figures 7, 8:
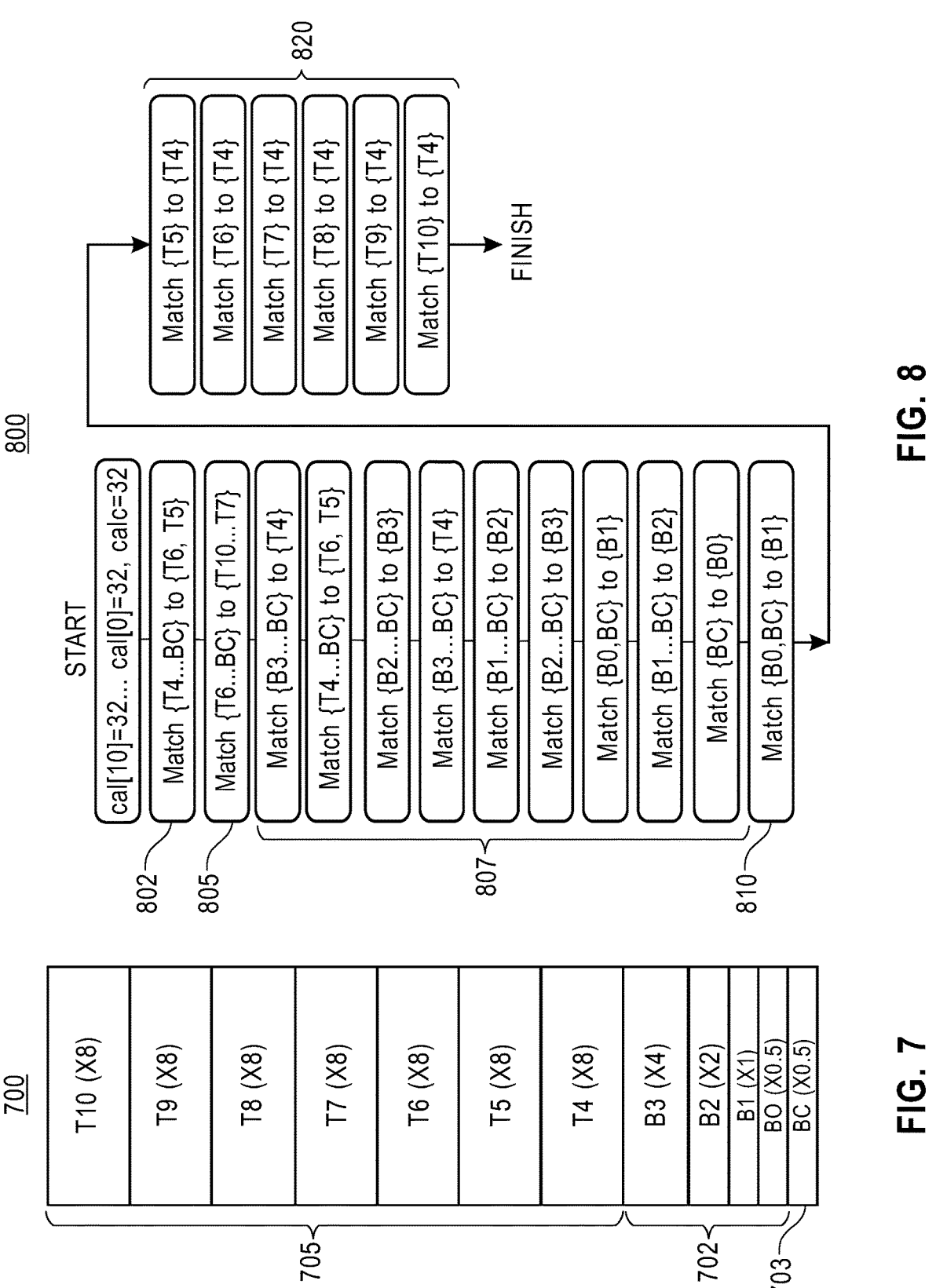
FIG. 7 illustrates an example 7-bit DAC 700 with 4 binary bits and 3 thermometer-encoded bits and including a spare calibration bit.
FIG. 8 is a flowchart depicting the calibration method described in connection with the sequence of steps shown in FIGS. 4A-4J and applied to the DAC presented in FIG. 7.

FIG. 7 illustrates an example 7-bit DAC 700 with 4-bit binary (B0-B3), e.g., DAC input code bits 702, and 3-bit thermometer encoded bits (T4-T10), e.g., DAC input code bits 705 and including a spare DAC calibration input bit (LSB-sized), i.e., a calibration spare segment 703. FIG. 8 is a flowchart depicting the calibration method 800 described in connection with the sequence of steps shown in FIGS. 4A-4J and applied to the DAC presented in FIG. 7. In FIG. 8, the calibration is applied to the 7-bit DAC 700 with 4-bit binary (B0-B3) and 3-bit thermometer encoding (T4-T10) of FIG. 7. The method 800 is a single ended calibration and includes a first step 802 of top-down matching output signal strength of the bottom quarter of the DAC with the output signal strength at its middle quarter, i.e., (Match {T4 . . . BC} to {T6,T5}), then a step 805 of matching the output signal strength of the top DAC half with the output signal strength of the bottom half, i.e., (Match {T6 . . . BC} to {T10 . . . T7}). This is then followed by further top-down matching steps 807 for binary calibration until the LSB B0 is calibrated at 810. At the end of the binary calibration steps, the segments T4, B3, . . . . B0 have correct values but the thermometer bits do not have identical values. Hence, further thermometer calibration steps 820 are performed to adjust the output signal strength of thermometer bits T10 . . . T5 to match the output signal strength of the calibrated segment for calibrated thermometer bit T4.

Note that at the end of the top-down calibration process, the total full swing range of the DAC (i.e. the output value for a 7-bit binary code 1111111) plus 1-LSB is equal to twice the pre-calibration strength of the top half of the DAC. This is unlike in a conventional bottom-up approach where the post calibration full swing range is proportional to the pre-calibration strength of the LSB. Hence the top-down calibration results in significantly less post-calibration variation in the DAC full swing than a conventional bottom-up approach.

The previous embodiments start with the calibration of the bottom half of the DAC relative to the top half; another embodiment consists in matching all the thermometer segments to their average value, then performing the calibration of the binary-weighted section of the DAC, as described previously. For example, by successively comparing and matching the thermometer segments pair-wise in an iterative process, the value of all the thermometer segments can be adjusted to be equal to the average initial value of those segments. This alternative embodiment is beneficial compared to the previously described one as the post-calibration absolute mismatch will be reduced, but it requires a longer calibration comprised of more steps.

The calibration process employing a top-down relative matching approach herein applied to a DAC employing CML device drivers, can be equally applied to DAC devices employing source-series-terminated (SST) device drivers either with or without thermometer bits.

Figure 5:
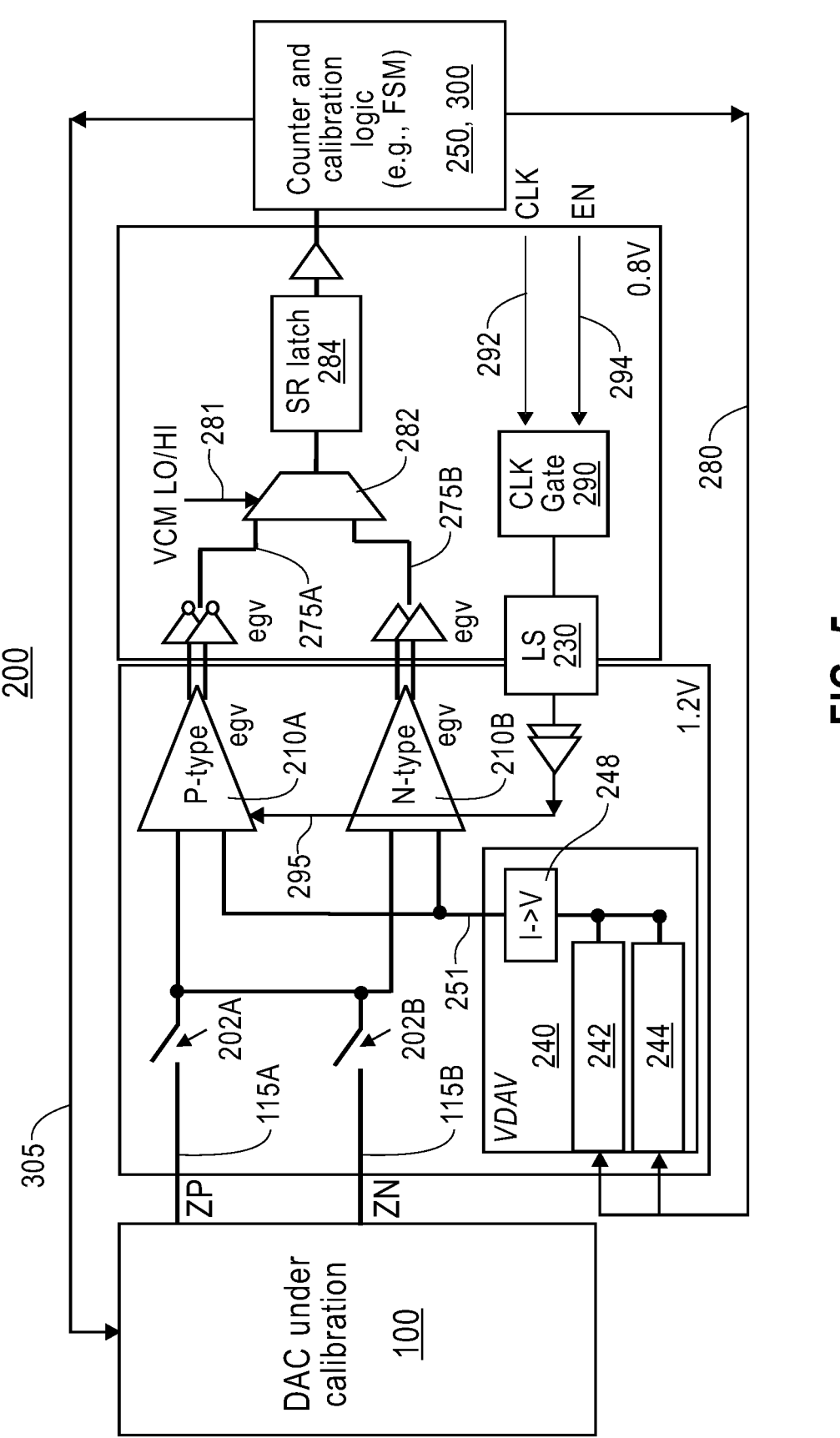
FIG. 5 depicts a more detailed block diagram of an output sensing circuit used for sensing differential output signals of the binary DAC segments of a DAC according to the calibration methods of the embodiments herein.

FIG. 5 depicts a more detailed block diagram of an output sensing circuit 200 used for sensing differential output signals of the DAC segments of a DAC 100 according to the calibration methods of the embodiments herein. As shown in FIG. 5, differential output rail lines ZP 115A and ZN 115B are input through respective switches 202A, 202B that are oppositely switched for input to each of respective P-type and N-type comparator devices 210A, 210B during respective ZP or ZN output calibration procedures. Both P-type and N-type comparator devices 210A, 210B are operable in two voltage domains (e.g., 0.8 V and 1.2 V) via an input 295 that is provided using a level shifter (LS) device 230 under control of gating circuitry including a clock (CLK) gate circuit 290 that responds to CLK signal 292 and enable signal 294. The use of two voltage domains allows the circuitry to simultaneously comply with the output of the DAC that can exceed the value of the low voltage supply and the requirements of the processing logic 250, 300 that run on the low voltage. Moreover, as the DAC output can cover a wide voltage range, two comparators with different input types (P-type 210A and N-type 210B) are alternatively selected. This guarantees that the input signal 115A, 115B is within the input common-mode range of at least one of the two comparators 210A, 210B for all settings of the DAC under calibration 100.

In the output sensing circuit 200 of FIG. 5, the VDAC 240 providing the Vref signal 251 input to each respective comparator 210A. 210B for comparison with DAC output voltage at the comparator includes a current DAC coarse adjustment block 242 and a current DAC fine adjustment block 244. These blocks are responsive to an input code signal 280 output from counter and calibration logic circuit 250 to generate a current signal that is converted to the Vref signal 251 using a current to voltage converter device 248 (which can be as simple as a load resistor in some embodiments). In an embodiment, the VDAC 240 needs a large resolution (>8 bits of TX DAC+1), but is only used for relative measurements. Any coarse/fine adjustment approach with overlap is acceptable.

In the output sensing circuit 200 of FIG. 5, a respective output signal 275A, 275B including a trigger signal output from both respective P-type and N-type comparator devices 210A, 210B under a matching condition, is input to a voltage controlled multiplexor 282 under control of multiplexor input control 281 and the output signal 275A or 275B is captured by a latch device 284 and is forwarded to the counter and calibration logic circuit 250, 300 (showed as a combined circuit block) which in embodiments herein can be a finite state machine. The counter and calibration logic circuit 250 responsively generates the input code signal 280 for input to each of the DAC coarse adjustment and fine adjustment blocks 242, 244. Further, the finite state machine provides logic that feeds back a calibration code (including tuning multiplication factor values a) along signal lines 305 and segment enable to the DAC 100 as calibration signals 305 during the DAC segment calibration process.

FIG. 6A illustrates an example embodiment of a current mode logic (CML) DAC 600 and FIG. 6B shows an embodiment of additional calibration and main segment circuitry used to provide the per-segment strength adjustment. In an example embodiment shown in FIG. 6A, the CML DAC 600 is a 7-bit segmented DAC with the 4 LSBs implemented as binary weighted segments 602 (B0 to B3) and the 3 MSBs implemented as 7 thermometer encoded segments 604 (T4-T10). The DAC 600 includes an additional segment 603 of nominal strength of 1 LSB, that is used for calibration purposes only, similar to the segment 103 of FIG. 1. The DAC 600 includes current mirror circuitry 630 that provides a global reference current Iglb<10:−1> 631 replicating an IREF input current to provide an equal current to each respective DAC bit segment of the DAC 600 (i.e., Iglb<−1>=Iglb<0> . . . =Iglb<10>. Each DAC bit segment associated with a respective digital input bit CAL, B0, B1 . . . . T10 is shown receiving a respective DAC calibration signal CAL<i> (i=−1, 0, 1, . . . 10) 665 from calibration circuitry 300.

FIG. 6B shows the detailed view of a CML DAC segment circuit 650 representative of each DAC segment i of the example DAC shown in FIG. 6A whose output signal strength is to be calibrated according to the methods herein. As shown in FIG. 6B, each DAC segment circuit 650 includes a DAC segment fine adjustment replica array sub-circuit 660 used to generate a respective bias voltage VB<i> 670 for that DAC segment and includes a fine adjust current IDAC 690 that receives a respective calibration signal CAL<i> 665. In response to a received calibration signal CAL<i> 665 at DAC segment i, fine adjust current IDAC 690 of replica array sub-circuit 660 generates an output current which is summed with the current Iglb<i> 631 for that segment. This summed current 632 is provided to driver replica circuit 680 to control the respective bias voltage VB<i> 670 for that DAC segment in response to the adjustment associated with input CAL<i> signal 665. The DAC segment circuit 650 further includes a segment driver circuit 685 providing the DAC differential output signals ZP 115A and ZN 115B for the DAC segment responsive to the adjusted bias voltage 670. Each CML DAC segment driver circuit 685 includes a pair of transistor devices NMOS 653 and PMOS 654 connected to the input data DP<i> (or DN<i> for opposite polarity) and a third NMOS transistor device 663 acting as an adjustable current source. The gate terminal of each transistor device 663 is connected to receive the voltage bias input VB<i> 670 generated by the fine adjustment sub-circuit 660 and driver replica circuit 680. Higher values of VB<i> result in a higher current being produced for the DAC differential output signals ZP 115A and ZN 115B while lower values of VB<i> result in a lower current for the DAC differential output signals ZP 115A and ZN 115B. The nominal output current ratio between the segments is also determined by the sizing of the driver transistors 653, 654 and 663. For example, the LSB segment would have a bias value VB<0> and sizes $W_1$, $W_2$ and $W_3$ for the transistors 653, 654, and 663, respectively, while the next significant bit of current strength nominally equal to twice that of the LSB segment would have the same bias value VB<1>=VB<0> but sizes $2W_1$, $2W_2$ and $2W_3$ for the transistors 653, 654, and 663.

In an embodiment shown in FIG. 6B, the replica array sub-circuit 660 used to generate a respective bias voltage VB<i> 670 for that DAC segment includes a current source composed of a fixed part and a per-segment adjustable part. That summed current 632 is sunk into a replica circuit 680. That replica circuit 680 comprises the same components (or appropriately scaled versions of those components) as a regular driver segment. Its control voltage VB<i> 670 is generated by an operational amplifier circuit, which sets VB<i> 670 such that the voltage $V_{REPD}$ at the output of the replica circuit 680 is equal to a separately generated voltage $V_{LOW}$.

Referring back to FIG. 6A, the mirror circuit 630 effectively acts as a current mirror and guarantees that each DAC segment i, biased by reference current IREF, generates an output current that contains a fixed component proportional to the reference current IREF. The output current of each DAC segment i also contains a variable (i.e., tunable) component which is adjusted by the digital code CAL<i>. The variable output current of the IDAC 690 in FIG. 6B is combined (through simple dotting) with the fixed current Iglb<i> 631 to form segment bias current 632. In some embodiments, Iglb<i> 631 can also be set as 0 ampere so that the strength of each DAC segment is directly proportional to the digital input CAL<i>. The individual calibration signals CAL<i> 665 received at the replica array circuit 660 tune or adjust the DAC circuit segment 650 corresponding to the respective individual DAC segment.

The method and circuits performing the calibration are simple enough to be integrated on-chip as part of a startup routine. The calibration method of FIGS. 4A-4J is not limited for application to TX DAC; any (high-speed) DAC would benefit from it.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays, or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be accomplished as one step, executed concurrently, substantially concurrently, in a partially or wholly temporally overlapping manner, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. The corresponding structures, materials, acts, and equivalents of all elements in the claims below are intended to include any structure, material, or act for performing the function in combination with other claimed elements as specifically claimed. The description of the present invention has been presented for purposes of illustration and description but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A system for calibrating a digital-to-analog converter device (DAC) comprising:

a comparator device having a first input receiving, in an iterative fashion, a first output voltage from a DAC under calibration in a first iteration and a second output voltage from the DAC under calibration in a second subsequent iteration, the first output voltage corresponding to a summation of outputs provided by a first subset of one or more DAC segments of the DAC being calibrated, and the second output voltage corresponding to a summation of outputs provided by a second subset of one or more DAC segments of the DAC being calibrated, the first subset of DAC segments being of a strength nominally equal to that of the second subset of DAC segments;

a voltage DAC (VDAC) circuit receiving, at the first iteration, an input digital word that is tuned to generate a reference output voltage substantially equal to the first output voltage, wherein at the first iteration, the comparator device receives at a second input, the generated reference output voltage and compares the first output voltage with the reference output voltage, and said input digital word is tuned until an output signal of the comparator device indicates that the reference output voltage generated by the VDAC is substantially equal to the first output voltage;

the comparator device, at the second iteration, receiving at the second input, the reference output voltage generated at the first iteration and comparing, at the second iteration, the received second output voltage with the reference output voltage, the comparator device providing an output signal based on a difference between the second output voltage and the reference output voltage; and a control logic circuit receiving said comparator device output signal, and in response to said comparator device output signal, generating one or more calibration signals for input to the DAC under calibration to tune the second subset of one or more DAC segments of the DAC being calibrated such that a strength of a summation of outputs provided by the second subset of one or more DAC segments substantially equals the reference output voltage, the control logic circuit iteratively tuning, using said one or more calibration signals, each of the relative strengths of DAC segment outputs of successive second subsets of DAC segments to match each of corresponding successive first subsets of DAC segments, the subsequent first subsets of DAC segments being of strengths nominally equal to those of the subsequent second subsets of DAC segments.

2. The system as claimed in claim 1, wherein for the iterative tuning, at each iteration, the first subset of DAC segments is associated with more significant DAC input bits while each second subset of DAC segments being adjusted with one or more calibration signals is associated with a number of lesser significant DAC input bits that when combined have a strength nominally equal to that of the first subset.

3. The system as claimed in claim 2, further comprising:

the comparator device further receiving, in a third iteration, a third output voltage from the DAC under calibration and in a fourth iteration, a fourth output voltage from the DAC under calibration, the third output voltage corresponding to an output provided by a DAC segment corresponding to a more significant bit than a most significant bit of the first subset of DAC segments and the fourth output voltage corresponding to a combined output of the DAC segments corresponding to all bits of both the first subset and second subset of DAC segments;

the voltage VDAC circuit receiving, at the third iteration, a further input digital word that is tuned to generate a further reference output voltage substantially equal to the third output voltage, wherein at the third iteration, the comparator device receives the generated further reference output voltage and compares the third output voltage with the further reference output voltage, and said further input digital word is tuned until an output signal of the comparator device indicates that the further reference output voltage is substantially equal to the third output voltage; and the comparator device, at the fourth iteration, receiving at the second input, the further reference output voltage generated at the third iteration and comparing, at the fourth iteration, the received fourth output voltage with the further reference output voltage, the comparator device providing a further output signal based on a difference between the fourth output voltage and the further reference output voltage; and the control logic circuit, in response to said further output signal, generating further calibration signals for input to the DAC under calibration to further tune the first subset and second subset of one or more DAC segments until a strength of a summation of outputs provided by the first subset and second subset of one or more DAC segments substantially equals the further reference output voltage.

4. The system as claimed in claim 3, wherein the DAC circuit device being calibrated is a binary DAC, said calibration signals ensuring a relative tuning of the DAC segments, wherein, when tuned, an output signal strength of a DAC segment associated with a current activated input bit is as a factor of 2 relative to a strength of an adjacent DAC segment associated with an adjacent activated input bit.

5. The system as claimed in claim 3, wherein the DAC circuit device being calibrated is a segmented DAC including one or more thermometer bits, said calibration signals ensuring that a tuned strength of a DAC segment associated with one thermometer input bit is substantially equal to a strength of a DAC segment associated with an adjacent DAC thermometer input bit.

6. The system as claimed in claim 3, wherein the DAC circuit device being calibrated includes a spare calibration input bit, and a DAC segment associated with said spare calibration input bit is tuned to provide a strength substantially equal to the strength of a DAC segment associated with a least significant bit (LSB).

7. The system as claimed in claim 1, wherein the digital word tuning input signal for tuning said voltage DAC circuit reference output voltage comprises one or more of: a coarse adjustment signal or fine adjustment signal for said voltage DAC circuit.

8. The system as claimed in claim 7, wherein the one or more coarse adjustment signal or fine adjustment signal for said voltage DAC circuit provides an output voltage reference signal of equal or greater resolution than the resolution of the output voltage associated with one or more DAC segments received at the first comparator input.

9. The system as claimed in claim 6, wherein the generated calibration signals for input to the DAC under calibration include a calibration signal for adjusting a DAC segment associated with the spare calibration bit.

10. The system as claimed in claim 3, wherein the further calibration signals generated for input to the DAC under calibration to further tune the first subset and second subset of one or more DAC segments applies a multiplication factor for adjusting the strength of each of the DAC segments of the first subset and second subset.

11. A method for calibrating a digital-to-analog converter device (DAC), the DAC having plural DAC segments generating an output voltage signal responsive to activated input bits, said method comprising:

receiving, at a first input of a comparator device, in an iterative fashion, a first output voltage from a DAC under calibration in a first iteration and a second output voltage from the DAC under calibration in a second subsequent iteration, the first output voltage corresponding to a summation of outputs provided by a first subset of one or more DAC segments of the DAC being calibrated, and the second output voltage corresponding to a summation of outputs provided by a second subset of one or more DAC segments of the DAC being calibrated, the first subset of DAC segments being of a strength nominally equal to that of the second subset of DAC segments;

receiving at a voltage DAC (VDAC) circuit, at the first iteration, an input digital word that is tuned to generate a reference output voltage substantially equal to the first output voltage, wherein at the first iteration, the comparator device receives at a second input, the generated reference output voltage and compares the first output voltage with the reference output voltage, and tuning said digital word until an output signal of the comparator device indicates that the reference output voltage generated by said VDAC is substantially equal to the first output voltage;

receiving at the second input of the comparator device, at the second iteration, the reference output voltage generated at the first iteration and comparing, by the comparator device at the second iteration, the received second output voltage with the reference output voltage, the comparator device providing an output signal based on a difference between the second output voltage and the reference output voltage; and receiving, at a control logic circuit, said comparator device output signal, and generating, at the control logic circuit, in response to said comparator device output signal, one or more calibration signals for input to the DAC under calibration to tune the second subset of one or more DAC segments of the DAC being calibrated such that a strength of a summation of outputs provided by the second subset of one or more DAC segments substantially equals the reference output voltage, and iteratively tuning, by the control logic circuit, using said one or more calibration signals, each of the relative strengths of DAC segment outputs of successive second subsets of DAC segments to match each of corresponding successive first subsets of DAC segments, the subsequent first subsets of DAC segments being of strengths nominally equal to those of the subsequent second subsets of DAC segments.

12. The method as claimed in claim 11, wherein for the iterative tuning, at each iteration, the first subset of DAC segments is associated with more significant DAC input bits while each second subset of DAC segments being adjusted with one or more calibration signals is associated with a number of lesser significant DAC input bits that when combined have a strength nominally equal to that of the first subset.

13. The method as claimed in claim 12, further comprising receiving, at the comparator device, in a third iteration, a third output voltage from the DAC under calibration and receiving in a subsequent iteration, a fourth output voltage from the DAC under calibration, the third output voltage corresponding to an output provided by a DAC segment corresponding to a more significant bit than a most significant bit of the first subset of DAC segments and the fourth output voltage corresponding to a combined output of the DAC segments corresponding to bits of both the first subset and second subset of DAC segments;

receiving, at the VDAC circuit, at the third iteration, a further input digital word that is tuned to generate a further reference output voltage substantially equal to the third output voltage, the comparator device receiving, at the third iteration, the generated further reference output voltage and comparing the third output voltage with the further reference output voltage, and tuning said further input digital word until an output signal of the comparator device indicates that the further reference output voltage is substantially equal to the third output voltage; and receiving, at the comparator device, at the fourth iteration, the further reference output voltage generated at the third iteration and comparing the received fourth output voltage with the further reference output voltage, the comparator device providing a further output signal based on a difference between the fourth output voltage and further reference output voltage; and responsive to said further output signal, generating at the control logic circuit, further calibration signals for input to the DAC under calibration to further tune the first subset and second subset of one or more DAC segments until a strength of a summation of outputs provided by the first subset and second subset substantially equals the further reference output voltage.

14. The method as claimed in claim 13, wherein the DAC being calibrated is a binary DAC, said calibration signals ensuring a relative tuning of the DAC segments, wherein, when tuned, an output voltage signal strength of a DAC segment associated with a current activated input bit is as a factor of 2 relative to an output voltage strength of an adjacent DAC segment associated with an adjacent activated input bit.

15. The method in claim 13, wherein the DAC circuit device being calibrated is a segmented DAC including one or more thermometer bits, said calibration signals ensuring that a tuned output voltage strength of a DAC segment associated with one activated thermometer input bit is substantially equal to an output voltage strength of a DAC segment associated with an adjacent DAC thermometer input bit.

16. The method as claimed in claim 13, wherein the DAC circuit device being calibrated includes a spare calibration input bit, and a DAC segment associated with said spare calibration input bit is tuned to provide an output voltage strength substantially equal to the strength of an output voltage of a DAC segment associated with a least significant bit (LSB).

17. The method as claimed in claim 11, wherein the digital word tuning input signal for tuning said voltage DAC circuit reference output voltage comprises one or more of: a coarse adjustment signal or fine adjustment signal for input to tune said voltage DAC circuit.

18. The method as claimed in claim 17, wherein the one or more coarse adjustment signal or fine adjustment signal for said voltage DAC circuit provides an output voltage reference signal of equal or greater resolution than the resolution of the output voltage associated with one or more DAC segments received at the first comparator input.

19. The method as claimed in claim 16, wherein the generated calibration signals for input to the DAC under calibration include a calibration signal for adjusting a DAC segment associated with the spare calibration bit.

20. The method as claimed in claim 13, wherein to further tune the first subset and second subset of one or more DAC segments, the generated one or more further calibration signals apply a multiplication factor for adjusting the strength of each of the DAC segments of the first subset and second subset.

\*   \*   \*   \*   \*